United States Patent [19]
McLaury

[11] Patent Number: 5,235,545
[45] Date of Patent: Aug. 10, 1993

[54] MEMORY ARRAY WRITE ADDRESSING CIRCUIT FOR SIMULTANEOUSLY ADDRESSING SELECTED ADJACENT MEMORY CELLS

[75] Inventor: Loren McLaury, Boise, Id.

[73] Assignee: Micron Technology, Inc., Boise, Id.

[21] Appl. No.: 677,348

[22] Filed: Mar. 29, 1991

[51] Int. Cl.[5] .............................................. G11C 8/00
[52] U.S. Cl. ........................ 365/189.04; 365/230.02; 365/230.03; 365/230.06; 365/230.08
[58] Field of Search ............... 365/189.04, 230.02, 365/230.03, 230.04, 230.06, 230.08, 230.09, 231

[56] References Cited

U.S. PATENT DOCUMENTS

4,845,678  7/1989  van Berkel et al. ............ 365/230.06

OTHER PUBLICATIONS

*Micron's MOS Data Book*, Section 1 and Section 3, (1990/A) pp. 1-1 to 1-121 and 3-1 to 3-102.
*Mitsubishi Data Book*, Section 4 (video memory), (1990). pp. 4-3 to 4-145.
*Electronic Design*, "Speed Memory, Ease Timing Reqirements with VRAM Functions", by Mailloux et al. Nov. 23, 1989.

*Primary Examiner*—Siegfried H. Grimm
*Attorney, Agent, or Firm*—Wells, St. John, Roberts, Gregory & Matkin

[57] ABSTRACT

A semiconductor memory circuit which comprises a plurality of memory cells and a plurality of address lines. Each address line has a line address within a sequence of line addresses and is connected to address at least one corresponding memory cell for writing when the address line is activated. The memory circuit has a multiple address latching circuit for sequentially receiving at least two spaced coded line addresses within the sequence of line addresses and for simultaneously activating a series of address lines having line addresses between the spaced line addresses, inclusive, to address corresponding memory cells for writing. The memory circuit also has an address comparator so that the spaced coded addresses may be received in any order.

49 Claims, 11 Drawing Sheets

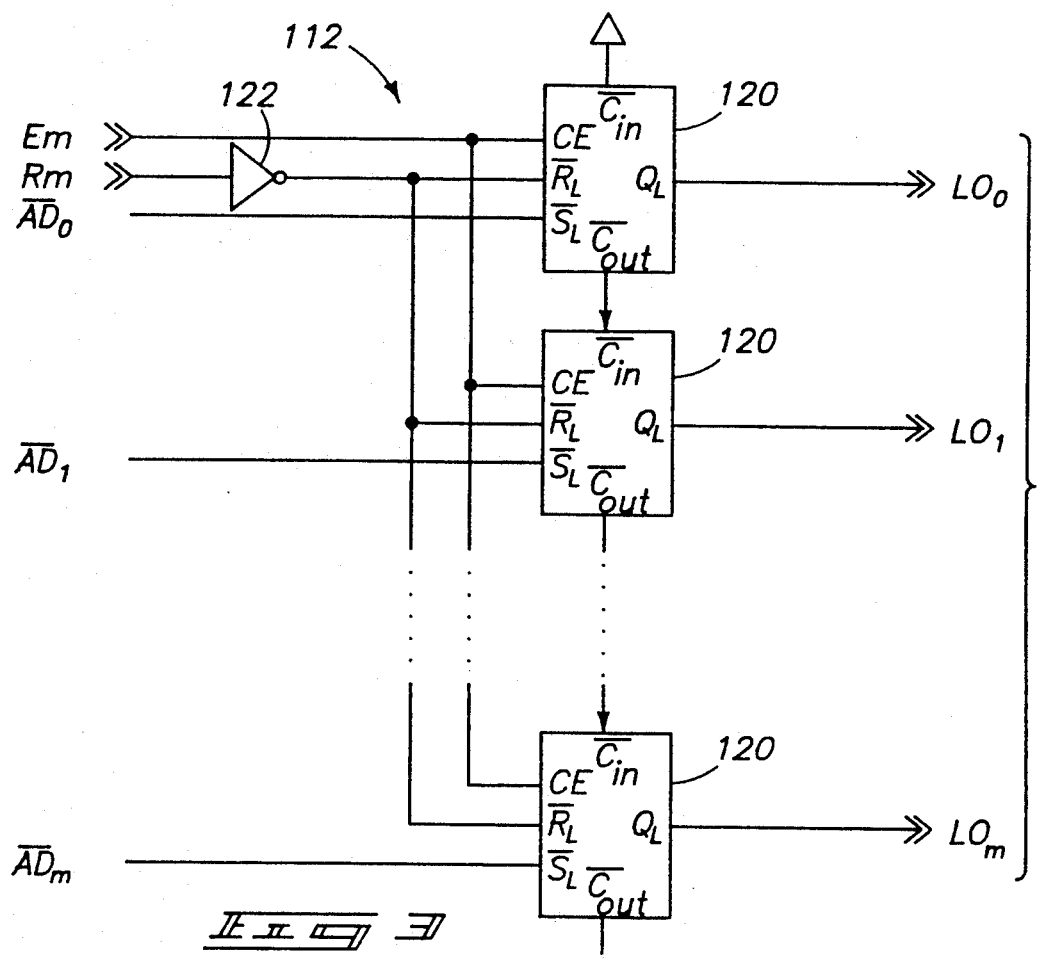
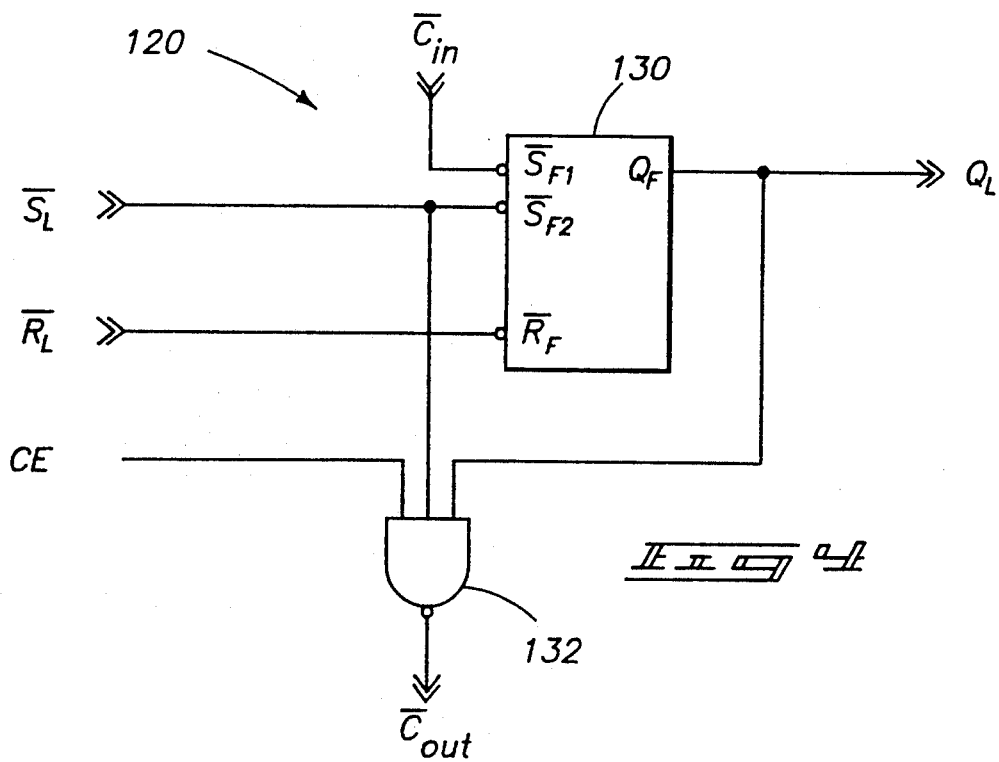

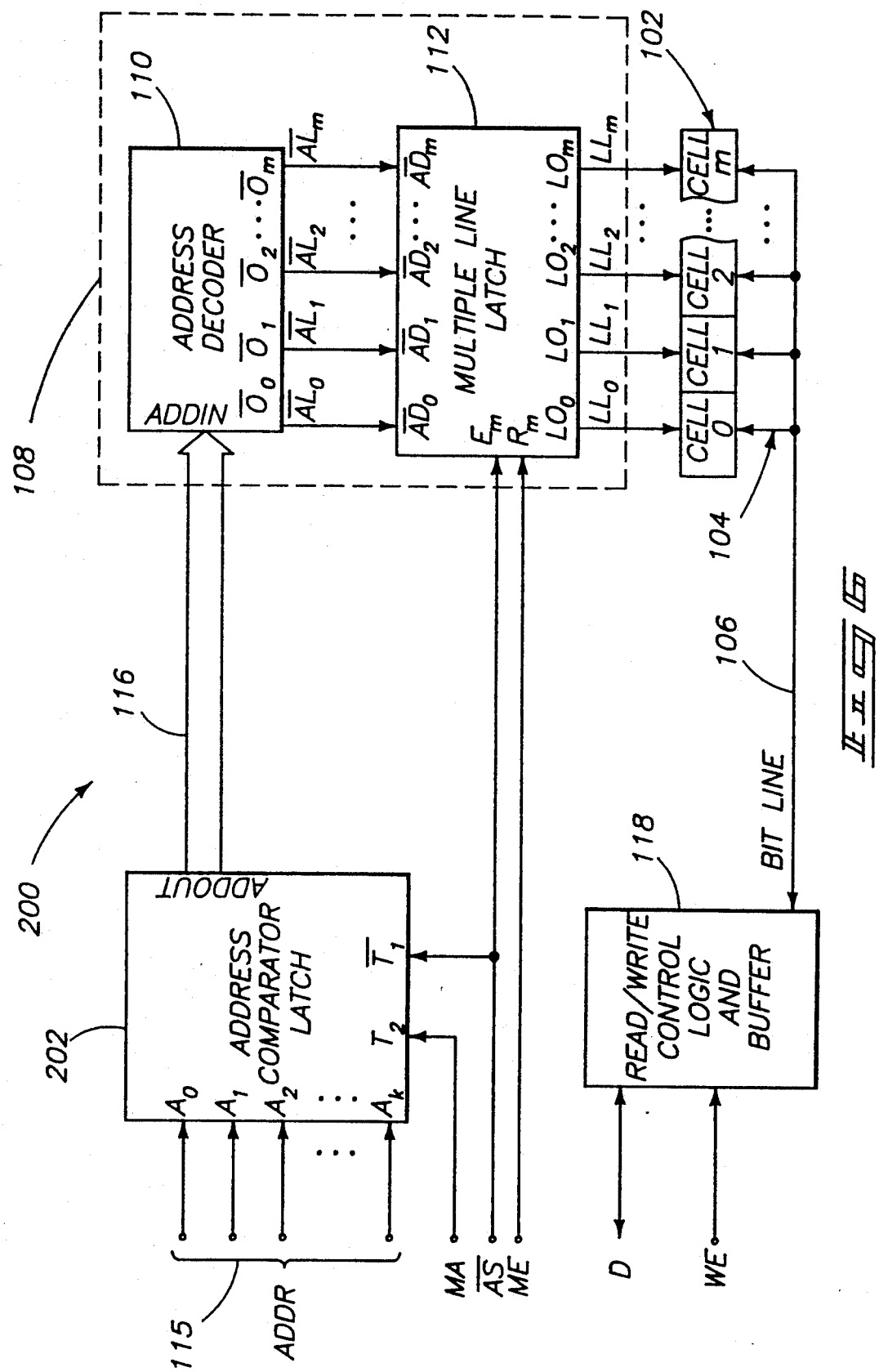

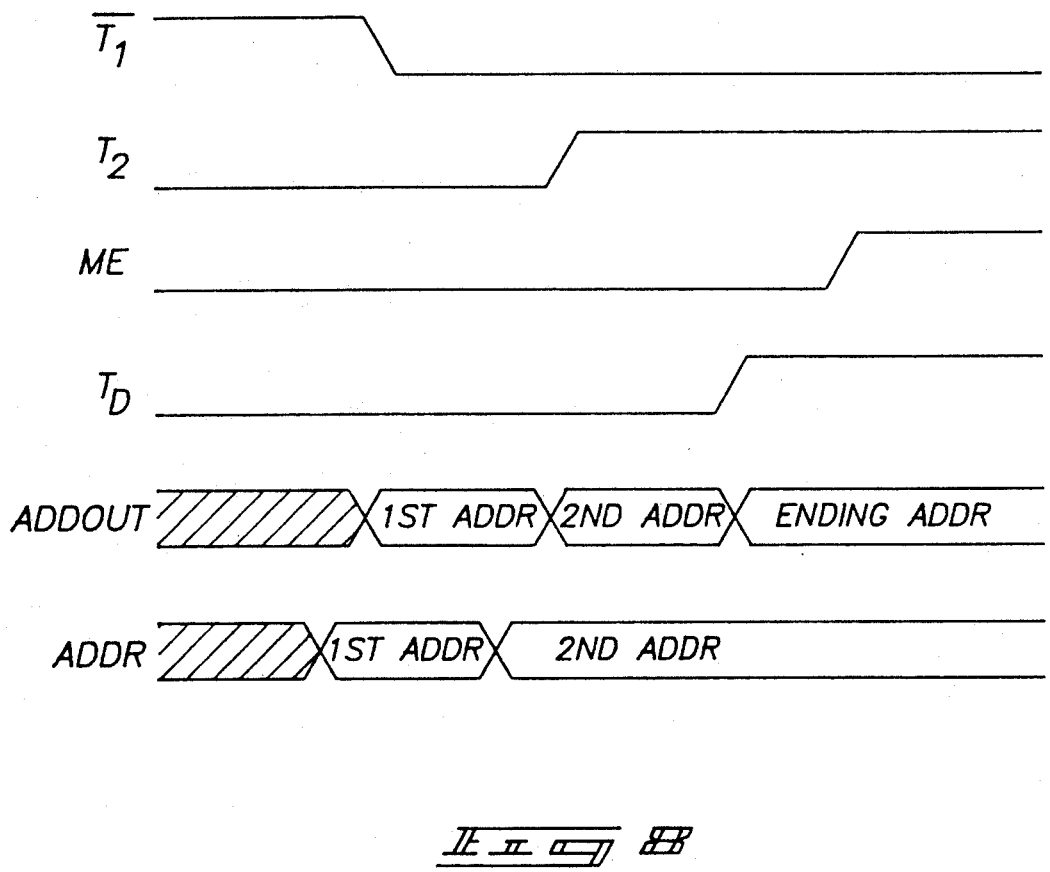

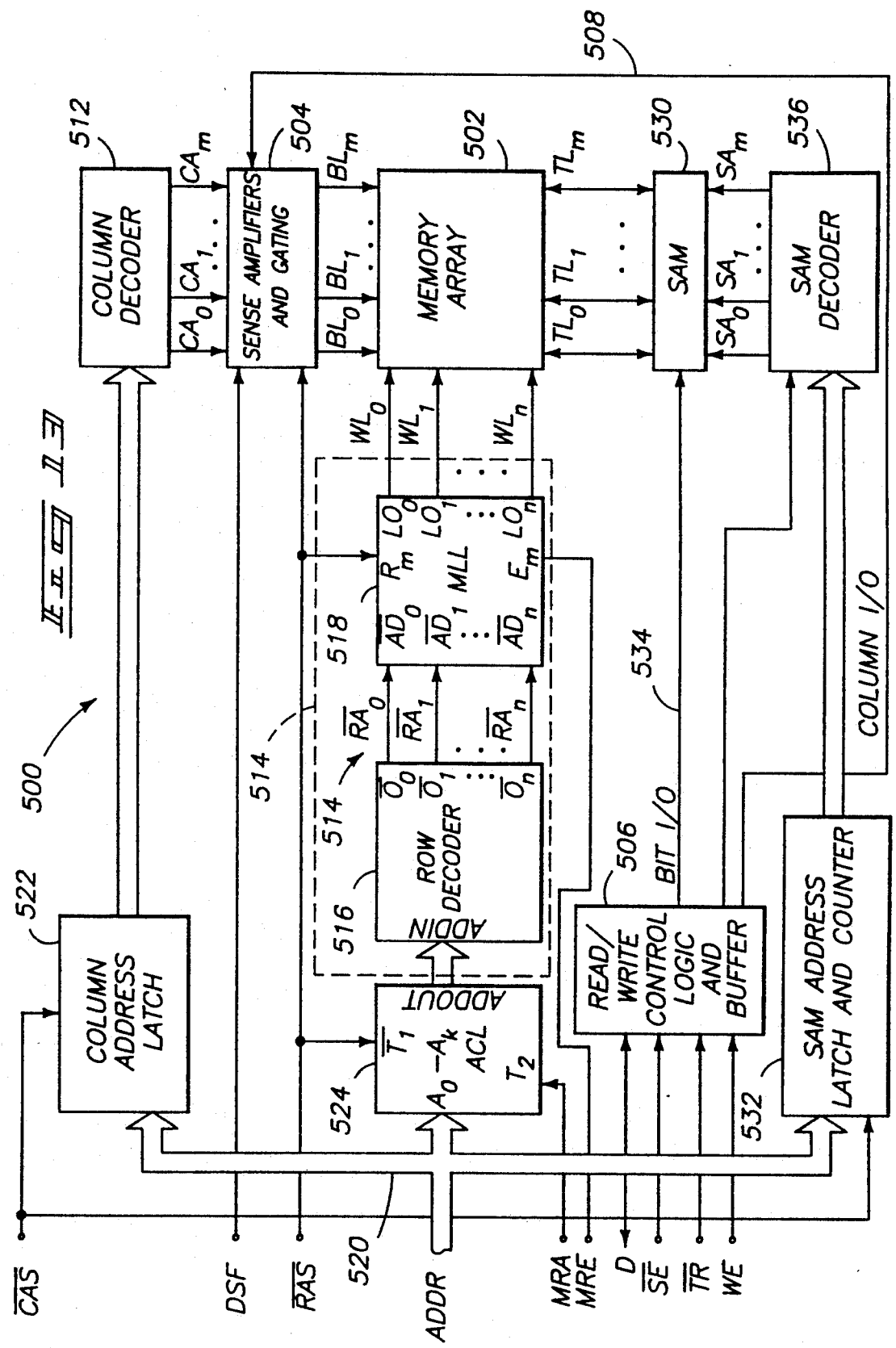

MEMORY ARRAY WRITE ADDRESSING CIRCUIT FOR SIMULTANEOUSLY ADDRESSING SELECTED ADJACENT MEMORY CELLS

TECHNICAL FIELD

This invention relates to memory array write addressing circuits which simultaneously address a plurality of contiguously addressed memory cells for writing.

BACKGROUND OF THE INVENTION

Semiconductor memory devices are commonly used in a variety of devices. Their most apparent use is in data processing systems, where they store programs and data. They also perform less obvious functions, such as I/O buffering and screen display control. In many of these applications, speed in writing to and reading from individual memory cells is a critical factor. However, systems designers are often forced to sacrifice speed to meet competing requirements of reduced size and cost.

Dynamic random access memory (DRAMs) are widely accepted memory devices because of their high density and low cost. Nonetheless, DRAMs do not always perform with the desired speed. Accordingly, shortening the time required to access individual memory cells in DRAMs is a significant and ongoing endeavor.

Besides shortening individual memory cell access times, designers have also sought to improve the efficiency of memory access cycles by eliminating repetitive specification of memory addresses. Accordingly, some DRAM's have alternate addressing modes such as page mode, static column mode, and nibble mode. DRAM's utilizing these addressing modes are described in Micron's MOS Data Book (1990/A), section 1, the disclosure of which is incorporated by reference. These methods of accessing memory cells nevertheless require a discrete access cycle for each memory cell which is read from or written to.

Most methods of memory access allow writing to only a single memory cell during each access cycle. However, a "flash write" mode has been used with some DRAMs to allow simultaneous writing of a single data bit to an entire row of memory cells. In a flash write cycle, only the address of a row within a two-dimensional memory array is specified. The single data bit is then written to every memory cell in the specified row of the memory array. Mitsubishi Data Book (1990) Section 4 (video memory), incorporated by reference, describes a DRAM which provides for flash write.

While flash write allows simultaneous writing to a significant group of memory cells, it is often impractical because, in many applications, it is somewhat rare to find an entire row which will be written to a single value. In contrast, an embodiment of the present invention allows addressing of an arbitrarily selected subset of memory cells within a row. Another embodiment of the invention allows addressing of multiple entire rows. These and other embodiments, described below, thus allow arbitrarily selected contiguous groups of memory cells to be addressed and written to a single logic value during a single write cycle. The time required to write to such a group of memory cells is, therefore, drastically reduced, resulting in a significant reduction in external circuit overhead. These advantages are obtained while maintaining compatibility with existing conventional DRAM circuits, so that write cycles directed to single memory cells may also be performed in the conventional manner.

BRIEF DESCRIPTION OF THE DRAWINGS

The preferred embodiments of the invention are illustrated in the accompanying drawings, in which:

FIG. 3 is a schematic block diagram of a multiple line latch according to this invention;

FIG. 4 is a detailed schematic block diagram of a line latch;

FIG. 6 is a schematic block diagram of a second preferred embodiment of a memory circuit according to this invention;

FIG. 7 is a schematic block diagram of an address comparator latch circuit according to this invention;

FIG. 8 is a timing diagram showing signals from the comparator latch circuit of FIG. 7;

FIG. 12 is a timing diagram showing signals from the memory circuit of FIG. 11; and FIG. 13 is a schematic block diagram of a fifth preferred embodiment of a memory circuit according to this invention.

DETAILED DESCRIPTION OF THE PREFERRED EMBODIMENTS

Figure 1:
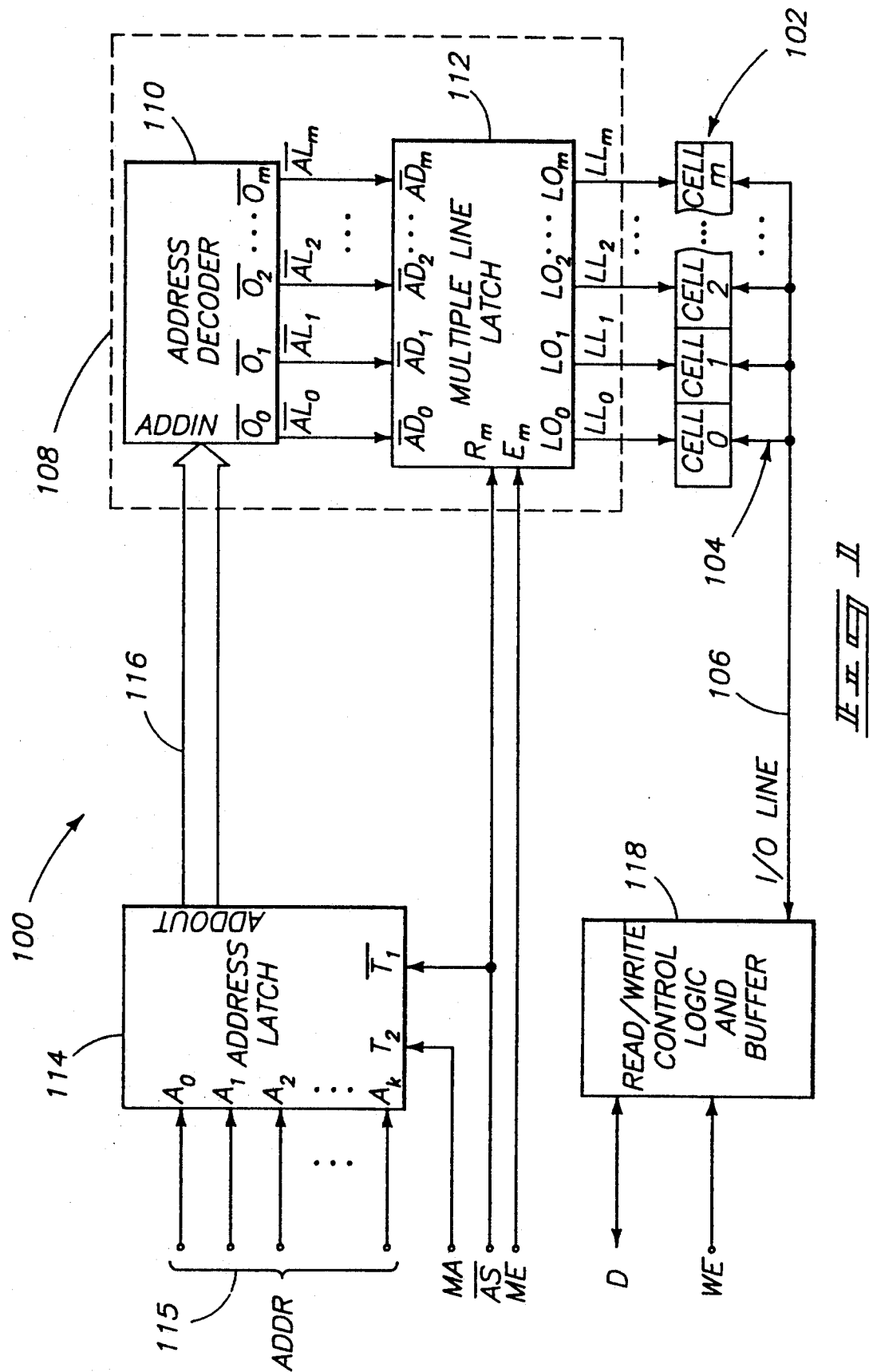
FIG. 1 is a schematic block diagram of a first preferred embodiment of a memory circuit according to this invention.

The following disclosure of the invention is submitted in furtherance with the constitutional purpose of the Patent Laws "to promote the progress of science and useful arts" (Article 1, Section 8).

As a preliminary matter, this invention concerns circuits that use voltages to represent binary logic values. Particular circuits may use varying voltage levels to represent the two binary logic values. Accordingly, the words "high" and "low" in this specification refer generally to voltages corresponding to the true and false binary logic values, respectively, within a given sub-circuit. Signals are generally considered "active" when they are high. However, a "*" following the signal name indicates that the signal has negative or inverse logic: it is considered active when low. These conventions will be used in the following written discussion. In the drawings, negative logic signals are indicated with a bar over the signal name.

As those familiar with the design of memory circuits will appreciate, the memory circuits described below have been simplified so that the overall circuits may be described with clarity. Circuits and connections which may not be familiar to those acquainted with common memory designs are, however, presented in detail. Furthermore, the specific circuits shown are merely examples of many ways in which memory circuits are implemented. This is particularly true with regard to control circuits and signals. The novel and claimed features of this invention, however, are applicable to memory circuits in general, regardless of specific circuit implementation.

A first preferred embodiment of a semiconductor memory circuit of this invention is illustrated in FIG. 1. The memory circuit is generally designated with the numeral 100.

Memory circuit 100 includes a linear or one-dimensional array 102 of address contiguous dynamic randomly accessible memory cells, individually labelled CELL 0 through CELL m. The memory cells have individual addresses within a sequence 0 through m to identify them within the single dimension of memory array 102. Memory circuit 100 is designed to simultaneously write to a plurality or group of the memory cells in a series when a beginning address and an ending address are received.

The memory cells are individually addressed through corresponding latched address lines $LL_0$ through $LL_m$. Latched address lines $LL_0$ through $LL_m$ are connected to address associated individual memory cells for writing. Address lines $LL_0$-$LL_m$ have line addresses within the sequence 0 through m, corresponding to the addresses of the memory cells which they address.

Each memory cell also has an individual bit line 104 for reading from or writing to a memory cell when it is addressed by the its associated latched address line $LL_0$-$LL_m$. Individual bit lines 104 are connected to a common I/O line 106.

Memory circuit 100 includes a multiple address latching means 108 comprising an address decoder 110 and a multiple line latch 112. Multiple address latching means 108 receives spaced coded memory cell addresses and simultaneously addresses a series of address contiguous memory cells within the linear array having addresses between the spaced memory cell addresses, inclusive, for writing. The memory cell addresses are customarily coded in binary.

Address decoder 110 has a coded address bus input ADDIN to sequentially receive spaced first and second coded line addresses. Address decoder 110 also has a plurality of decoded address outputs $O_0^*$ through $O_m^*$ which are activated in response to receiving corresponding coded addresses at coded address bus input ADDIN. Each decoded output $O_0^*$-$O_m^*$ corresponds to a single coded memory cell address within the sequence 0 through m and to the memory cell having that address.

Multiple address latching means 108 also includes multiple line latch 112, which has a plurality of address line inputs $AD_0^*$ through $AD_m^*$ for receiving decoded address signals. The number of address line inputs is equal to the number of memory cells within memory array 102, and varies depending on the particular circuit. Address line inputs $AD_0^*$-$AD_m^*$ are connected to decoded address outputs $O_0^*$-$O_m^*$ of address decoder 110 through a plurality of address lines $AL_0^*$ through $AL_m^*$. Multiple address latching means 108 also has a plurality of latched line outputs $LO_0$ through $LO_m$, corresponding to address line inputs $AD_0^*$ through $AD_m^*$ and connected to corresponding latched address lines $LL_0$-$LL_m$.

Multiple line latch 112 further includes a reset input $R_m$, which receives an address strobe signal AS*, and an enable input $E_m$ which receives a multi-address enable signal ME.

Memory circuit 100 further comprises an address latch 114 which has address inputs $A_0$ through $A_k$ for receiving and latching a coded address signal ADDR. Address inputs $A_0$ through $A_k$ receive coded addresses from a multiplexed address bus 115 connected to a coded address generator (not shown). Address latch 114 has a latched address bus output ADDOUT and first and second strobe inputs $T_1^*$ and $T_2$. First strobe input $T_1^*$ receives address strobe signal AS*. Second strobe input $T_2$ receives a multi-address strobe signal MA. Latched address bus output ADDOUT is connected to coded address bus input ADDIN of address decoder 110 through a latched address bus 116.

A read/write control logic and buffer circuit 118 receives common I/O line 106. Control circuit 118 is connected to a write data signal D and a write enable signal WE. Control circuit 118 also receives and produces other control signals (not shown) which govern various timing and operational aspects of memory cell read and write cycles.

In operation, address latch 114 initially sequentially receives a first or beginning coded line address and a second or ending coded line address from address bus 115. These addresses correspond, respectively, to memory cell addresses of two spaced memory cells in the series 0 to m. In this embodiment, the first coded address on bus 115 identifies a beginning memory cell address and the second coded address identifies an ending memory cell address. The multiple address latching means 108, in response to receiving the beginning and ending memory cell addresses, automatically activates the plurality or series of memory cell latched address lines $LL_0$-$LL_m$ having line addresses between the beginning and ending addresses, inclusive. This enables simultaneous writing to the plurality of memory cells having addresses in the sequence between the beginning memory cell address and the ending memory cell address.

Figure 2:
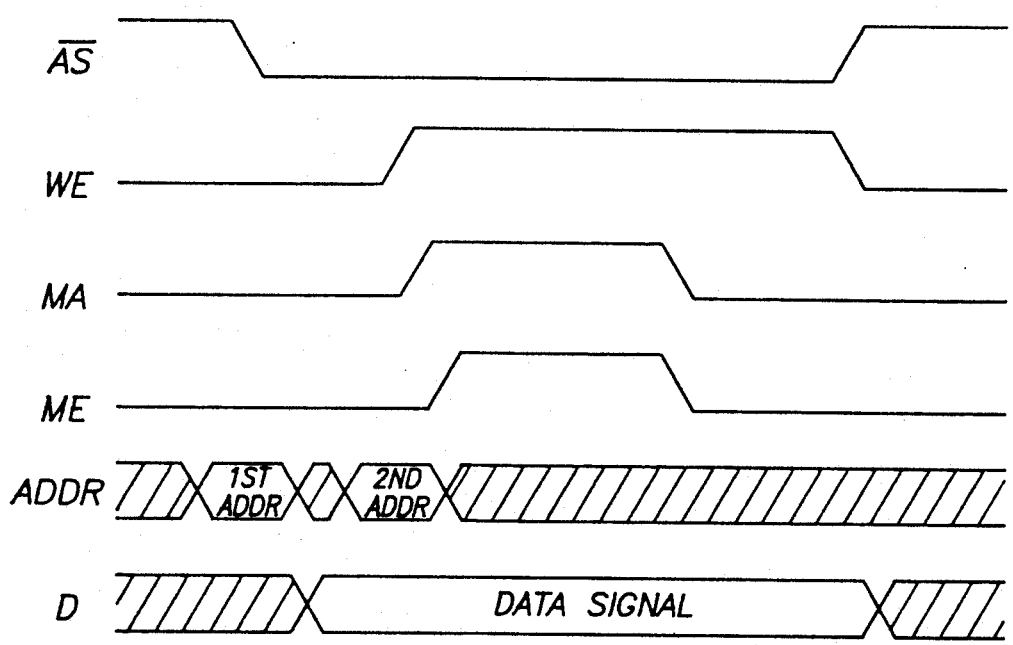
FIG. 2 is a timing diagram showing signals from the memory circuit of FIG. 1.

More specifically, as illustrated in FIG. 2, address strobe signal AS* goes low while the first coded line address is being received, causing address latch 114 to latch the first coded line address at latched address bus output ADDOUT. Multi-address strobe signal MA subsequently goes high while the second coded line address is received, causing address latch 114 to latch the second coded line address at latched address bus output ADDOUT.

Address decoder 110 thus sequentially receives the latched first and second coded line addresses at its coded address but input ADDIN. In response to each coded address received at ADDIN, the address decoder decodes the coded address and sequentially activates the corresponding decoded output $O_0^*$-$O_m^*$.

Multiple line latch 112 sequentially receives the first and second line addresses in decoded form from address decoder 110 through address lines $AL_0^*$-$AL_m^*$. In response to these addresses, and the subsequent activation of multi-address enable signal ME, multiple line latch 112 simultaneously activates a set or group of latched address lines $LL_0$-$LL_m$ having line addresses between the first and second line addresses to address the plurality of memory cells corresponding to the multiple latched address lines.

More specifically, in operation reset input $R_m$ is for resetting latched line outputs $LO_0$-$LO_m$ to their inactive state (low). Accordingly, address strobe signal AS*, connected to $R_m$, is initially high to reset latched line outputs $LO_0$-$LO_m$ in preparation for a write cycle. As noted above, however, AS* goes low while the first coded address is received by address latch 114. AS* is held low for the entire write cycle so that multiple line latch 112 will not be reset. After completion of the write cycle, AS* goes high to reset latched line outputs $LO_0$-$LO_m$.

Initially, then, all latched address lines $LL_0$-$LL_m$ are inactive. Subsequently, address decoder 110, while receiving the first coded line address from address latch 114, activates the address line $AL_0^*$-$AL_m^*$ corresponding to the first line address. In response, multiple line latch 112 activates and latches a first corresponding latched address line $LL_0$-$LL_m$. Then, while receiving the second coded line address from address latch 114, address decoder 110 activates the address line $AL_0^*$-$AL_m^*$ corresponding to the second line address. In response, multiple line latch 112 activates and latches a second corresponding latched address line $LL_0$-$LL_m$.

After multiple line latch 112 receives and latches both the first and second addresses, multi-address enable signal ME goes high. In response, multiple line latch 112 activates and latches all intermediate latched address lines $LL_0$-$LL_m$ having addresses between the address of the first latched address line and the address of the second latched address line. Accordingly, all memory cells having addresses between the beginning and ending addresses, inclusive, are simultaneously addressed for writing.

Note that multiple line latch 112 is transparent to normal write and read addressing cycles. That is, when enable input $E_m$ remains inactive, activated address line inputs $AD_0^*$-$AD_m^*$ are simply passed through to latched line outputs $LO_0$-$LO_m$.

Concurrently with addressing the contiguous group or series of memory cells as described above, a valid write data signal D is presented to read/write control logic and buffer circuit 118. Activation of write enable signal WE enables simultaneous writing to the addressed group or series of memory cells. The write operation can optionally be commenced before addressing is complete.

FIG. 3 shows a simplified schematic diagram of multiple line latch 112. Multiple line latch 112 comprises a plurality of line latches 120, connected between address line inputs $AD_0^*$-$AD_m^*$ and corresponding latched line outputs $LO_0$-$LO_m$. A single line latch 120 therefore corresponds to each cell in memory array 102 and to each latched address line $LL_0$-$LL_m$. Each line latch 120 has a carry enable input CE, a latch reset input $R_L^*$, a latch set input $S_L^*$, a carry-in input $C_{in}$, a carry-out output $C_{out}^*$, and a latched output $Q_L$.

Line latches 120 are arranged consecutively in a series, with the carry-out output $C_{out}^*$ of each line latch 120 being received by the carry-in input $C_{in}^*$ of the next line latch 120 of the series. The latch set inputs $S_L^*$ of consecutive line latches 120 are connected to address line inputs $AD_0^*$-$AD_m^*$, respectively. The latch outputs $Q_L$ of consecutive line latches 120 are, in turn, connected to latched line outputs $LO_0^*$-$LO_m^*$, respectively. The carry-in input $C_{in}^*$ of the first line latch 120 in the series is connected to a high logic voltage. The carry-out output $C_{out}^*$ of the last line latch 120 in the series is unconnected.

The carry enable inputs CE of all line latches 120 are connected in common to enable input $E_m$. Latch reset inputs $R_L^*$ are connected in common and then to reset input $R_m$ through an inverter 122.

The operation of an individual line latch 120 may be more easily understood by referring to FIG. 4, which shows a logic implementation of a single line latch 120.

Each line latch 120 comprises an SR flipflop 130 and a three-input NAND gate 132. SR flipflop 130 has a first flipflop set input $S_{F1}^*$, connected to carry-in input $C_{in}^*$, and a second flipflop set input $S_{F2}^*$, connected to latch set input $S_L^*$. A flipflop reset input $R_F^*$ is connected to latch reset input $R_L^*$. A flipflop output $Q_F$ is connected to latch output $Q_L$. Three-input NAND gate 132 has an output connected to carry-out output $C_{out}^*$, and inputs connected to carry enable input CE, latch set input $S_L^*$, and flipflop output $Q_F$, respectively.

In operation, flipflop 130 performs as a conventional SR-type flipflop. A low at reset input $R_F$ resets output $Q_F$ to a low, and a high at either first or second set input $S_{F1}$ or $S_{F2}$ sets output $Q_F$ to a high. Flipflop reset input $R_F^*$ receives a signal which is the inverse of address strobe signal AS*. Accordingly, referring to FIG. 2, $R_F^*$ is high during a write cycle. Therefore, flipflop output $Q_F$ can be set during the write cycle by a low at set input $S_{F2}$, which is connected to a single decoded address output $O_0^*$-$O_m^*$ from address decoder 110. The single decoded address output becomes low when the corresponding line address is being received by address decoder 110.

Thus, as address decoder 110 receives the first and second coded line addresses, corresponding line latches 120 will receive first and second decoded line addresses, and will activate and latch corresponding latched line outputs $LO_0$-$LO_m$.

Subsequently, multi-address enable signal ME goes high (FIG. 2), presenting a high to enable input $E_m$ of multiple line latch 112, carry enable inputs CE of line latches 120, and an input of three-input NAND gate 132. With CE high, $C_{out}^*$ of any individual line latch 120 will be active (low) if $Q_F$ of the same line latch 120 is high and if $S_{F2}^*$ of the same line latch 120 is high (inactive). If $C_{out}^*$ is low, the subsequent line latch 120 will be set through its set input $S_{F1}^*$. In this manner, an active $C_{out}$ signal will propagate through subsequent line latches 120, setting their outputs $Q_L$, until it reaches a line latch whose $S_L^*$ input is active (low). As long as the ending memory cell address is being received when $E_m$ goes active, all line latches corresponding to addresses between the beginning and ending memory cell addresses, inclusive, will have their outputs $Q_L$ latched. Accordingly, corresponding address lines $LL_0^*$-$LL_m^*$ will be activated and latched, addressing the corresponding memory cells for writing.

Figure 5:
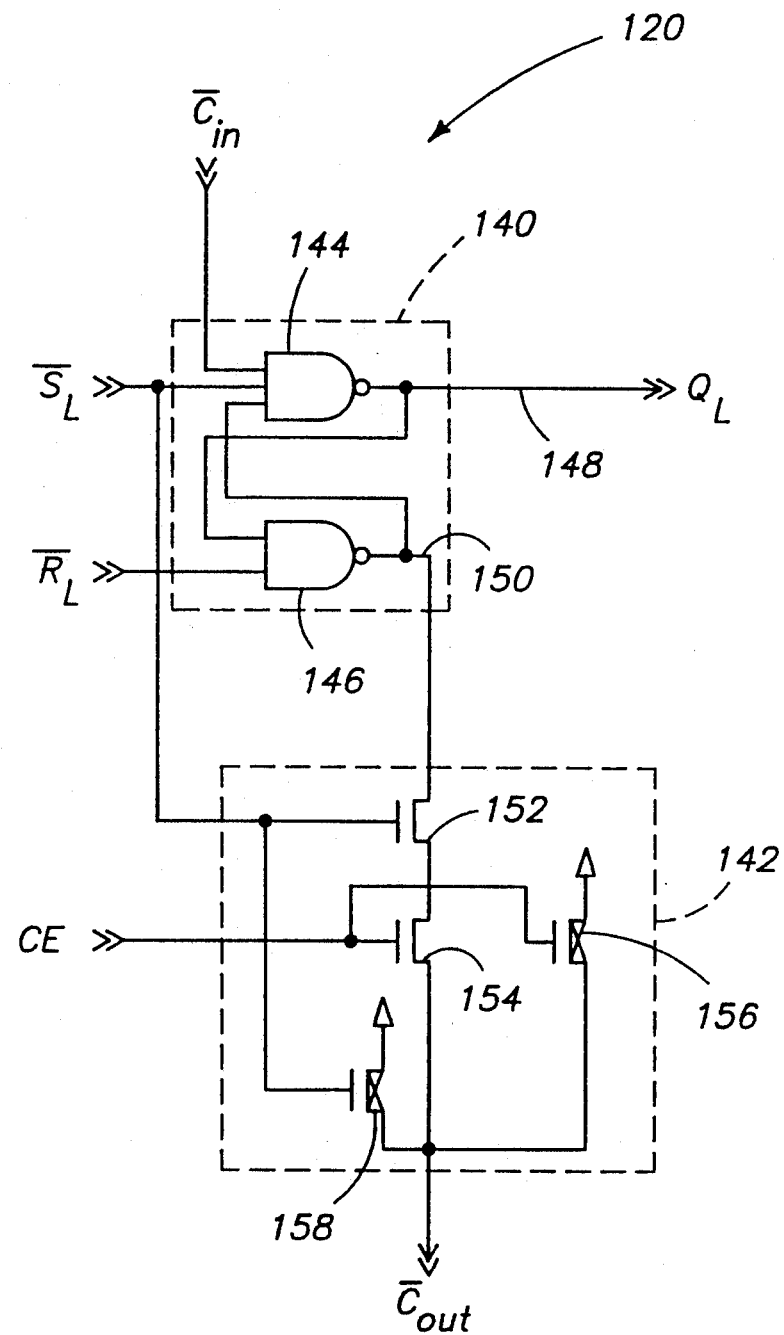
FIG. 5 is a schematic diagram of a CMOS implementation of the line latch of FIG. 4.

FIG. 5 illustrates a CMOS implementation of line latch 120. Line latch 120 comprises an SR flipflop 140 and a three-input NAND gate 142. SR flipflop 140 includes a conventional CMOS three-input NAND gate 144 and a conventional CMOS two-input NAND gate 146. The output of NAND gate 144 is connected to an input of NAND gate 146, and the output NAND of gate 146 is connected to an input of NAND gate 144. NAND gates 144 and 146 are thus cross coupled to form complementary Q and Q* outputs 148 and 150, respectively. The remaining input of NAND gate 146 is connected to latch reset input $R_L^*$, and the remaining two-inputs of NAND gate 144 are connected to carry-in input $C_{in}^*$ and latch set input $S_L^*$, respectively.

Three-input NAND gate 142 comprises n-channel MOS transistors 152 and 154 and p-channel MOS transistors 156 and 158. Transistor 152 has a drain connected to Q* output 150 of SR flipflop 140, and a source connected to the drain of transistor 154. The source of transistor 154 is connected to carry-out output $C_{out}^*$. Transistor 156 has a source connected to $V_{cc}$ and a drain connected to carry-out output $C_{out}^*$. Transistor 158 has a source connected to $V_{cc}$ and a drain connected to carry-out output $C_{out}^*$. The gates of transistors 152 and 158 are connected to latch set input $S_L^*$. The gates of transistors 154 and 156 are connected to carry enable input CE.

Three-input NAND gate 142, by taking advantage of $Q^*$ output 150 of SR flipflop 140, has only four transistors as compared to six transistors in a conventional three-input NAND gate. NAND gate 142 generates a low output at carry-out at $C_{out}^*$ only when (1) $Q^*$ output 150 is low, (2) carry enable input CE is high, and (3) latch set input $S_L^*$ is high.

Additional features are included in a second preferred embodiment, illustrated in FIG. 6. The memory circuit is generally designated with the numeral 200. Memory circuit 200 has many common components as memory circuit 100 of FIG. 1. Such common components are identified with the same numerals.

Memory circuit 200 includes an address comparator latch 202. Address comparator latch 202 has address inputs $A_0$ to $A_k$ for receiving and latching a coded address signal ADDR. Address inputs $A_0$ through $A_k$ receive coded addresses from address bus 115. Address comparator latch 202 has a latched address bus output ADDOUT and first and second strobe inputs $T_1^*$ and $T_2$. First strobe input $T_1^*$ receives address strobe signal $AS^*$. Second strobe input $T_2$ receives multiaddress strobe signal MA. Latched address bus output ADDOUT is connected to coded address bus input ADDIN of address decoder 110 through latched address bus 116.

In operation, address comparator 202 receives the spaced coded line addresses in random order from address bus 115. Thus, in memory circuit 200, the first coded address does not necessarily correspond to the beginning coded address, nor does the second coded address necessarily correspond to the ending coded address. Address comparator latch 202 produces the first and second coded addresses, as they are received and latched, at latched address bus output ADDOUT. After presenting the second coded line address, however, address comparator latch 202 compares the spaced coded line addresses to determine the beginning line address and the ending line address. It then produces the ending line address at latched address output ADDOUT. This is necessary to ensure correct operation of multiple line latch 112 when multi-address enable signal ME is activated to address the series of memory cells.

A logic implementation of address comparator latch 202 is shown in FIG. 7. A first latch 204 and a second latch 206 receive address inputs $A_0$ through $A_k$. First latch 204 is triggered by first strobe input $T_1^*$. Second latch 206 is triggered by second strobe input $T_2$.

An address comparator 208 receives the latched coded line addresses from first and second latches 204 and 206 at address comparator bus inputs ADD1 and ADD2, respectively. Address comparator 208 has a comparator output G which is high only when the coded address presented ADD2 is greater than the coded address presented at ADD1.

Address comparator latch 202 further comprises first, second and third inverters 210, 212 and 214, and first, second and third NAND gates 216, 218 and 220. A multiplexer 222 has bus inputs IN1 and IN2 connected to receive the latched coded line addresses from first latch 204 and second latch 206, respectively. Multiplexer 222 receives a control input C and produces a bus output OUT which is connected to latched address output ADDOUT. If control input C is high, multiplexer 222 produces the coded line address from first latch 204 at multiplexed output OUT. If control input C is low, multiplexer 222 produces the coded line address from second latch 206 at multiplexed output OUT.

More specifically, one input of first NAND gate 216 is connected through first inverter 210 to first strobe input $T_1^*$. The other input of first NAND gate 216 is connected through second inverter 212 to second strobe input $T_2$. One input of third NAND gate 220 is connected through third inverter 214 to comparator output G. The other input of third NAND gate 220 is connected through a signal delay circuit 224 to second strobe input $T_2$. Signal delay circuit 224 produces an output signal $T_D$ which is the time-delayed equivalent of second strobe input $T_2$. Second NAND gate 218 has an input connected to the output of first NAND gate 216 and another input connected to the output of third NAND gate 220. The output of second NAND gate 218 is connected to control input C of multiplexer 222.

FIG. 8 shows the operational timing of address comparator latch 202. First strobe input $T_1^*$ receives $AS^*$ and therefore goes low as the first coded line address is received at address inputs $A_0$ through $A_k$. In response, the first coded line address is latched by first latch 204 and presented to address bus inputs ADD1 of address comparator 208 and bus input IN1 of multiplexer 222.

First inverter 210 produces a high at the input of first NAND gate 216. Second strobe input $T_2$, which receives multi-address strobe signal MA, is low causing second inverter 212 to also present a high to first NAND gate 216. NAND gate 216 thus produces a low at its output, in turn causing second NAND gate 218 to produce a high at control input C of multiplexer 222. Multiplexer 222 then places the coded address present at its bus input IN1, i.e., the first coded line address, at ADDOUT.

Second strobe input $T_2$ subsequently goes high as the second coded line address is received at address inputs $A_0$ through $A_k$. The second coded line address is thus latched by second latch 206 and presented to address bus input ADD2 of address comparator 208 and to bus input IN2 of multiplexer 222. Inverter 212 produces a low, forcing first NAND gate 216 to present a high to second NAND gate 218. However, because of line delayed circuit 224, delay signal $T_D$ remains low momentarily. Third NAND gate 220 therefore is forced to present a high to second NAND gate 218. Accordingly, second NAND gate 218 presents a low to control input C of multiplexer 222. The coded address present at bus input IN2, i.e., the second coded line address, is thus presented at latched address bus output ADDOUT.

After a short delay, however, and before multi-address signal ME goes high to enable multiple line latch 112, delayed signal $T_D$ follows second strobe input $T_2$ high. Third NAND gate 220 is thus enabled to produce either a high or low depending on the state of comparator output G. Since first NAND gate 216 is producing a high, second NAND gate 218 is enabled to present the inverse of comparator output G to control input C of multiplexer 222. If the second coded line address is greater than the first coded line address, comparator output G will be high and control input C will receive a low. Otherwise, comparator output G will be low and control input C will receive a high. Thus multiplexer 222 is controlled to present the greater of the first and second coded line addresses, i.e., the ending line address, at latched address bus output ADDOUT before multiple line latch 112 is enabled to activate intermediate latched address lines $LL_0$-$LL_m$.

Accordingly, both memory circuits 100 and 200 provide a method of addressing in which a defined contiguous series of memory cells may be written to in a single write cycle by specifying a beginning and an ending address. Memory circuit 200 further provides an address comparator means so that the beginning and ending address may be received in random order. The circuits 100 and 200 also retain the capability of writing to only a single cell if only a single address is specified.

Figure 9:
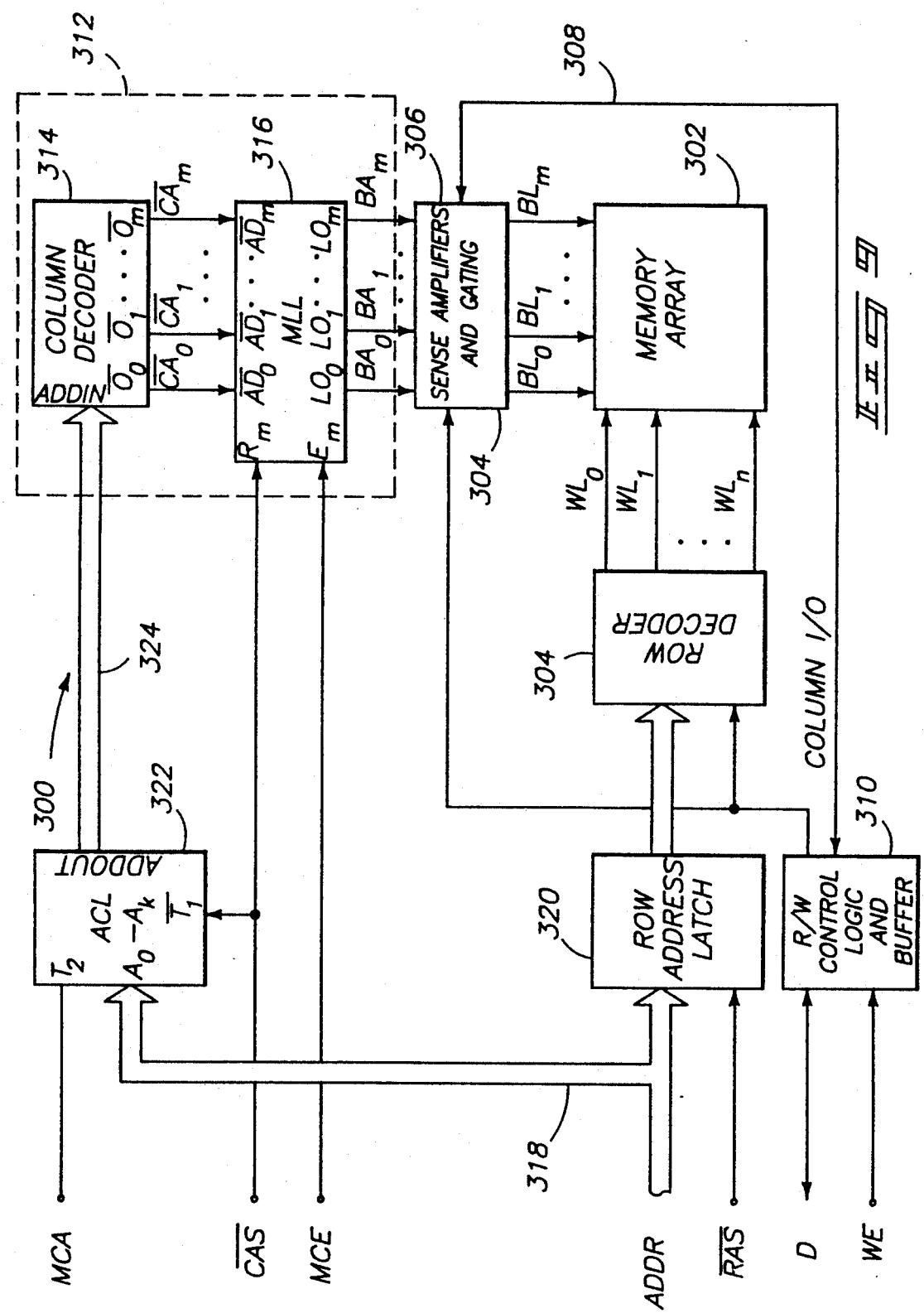
FIG. 9 is a schematic block diagram of a third preferred embodiment of a memory circuit according to this invention.

A third preferred embodiment of a semiconductor memory circuit of this invention is shown in FIG. 9. The memory circuit is generally designated by the numeral 300.

Memory circuit 300 includes a two-dimensional dynamic random access memory array 302. Memory array 302 has a plurality of memory cells arranged in rows and columns. Each row of memory cells has a row address in the sequence 0 through n to and each column of memory cells has a column address in the sequence 0 through m. Memory cells are therefore uniquely identified in two-dimensional array 302 by a pair of matrix addresses: a row address and a column address.

Memory array 302 receives a plurality of word address lines $WL_0$ through $WL_n$ and a plurality of bit access lines $BL_0$ through $BL_m$. Word address lines $WL_0$-$WL_n$ have addresses corresponding to the series of row addresses and are connected to selectively address a corresponding row of memory cells for writing. Bit access lines $BL_0$-$BL_m$ have addresses corresponding to the series of column addresses and are connected to write to and read from memory cells within a corresponding column.

Each memory cell of memory array 302 comprises a MOS access transistor and a capacitive storage element (not shown). A storage element is written to by turning on the corresponding storage transistor and imposing a selected voltage on the storage element through the access transistor. More specifically, one of word address lines $WL_0$-$WL_n$ is connected to the gates of all access transistors in a single row. One of bit access lines $BL_0$-$BL_n$ is connected, through access transistors, to every storage element in a single column. Thus, writing to an individual memory cell is accomplished by activating the appropriate word address line $WL_0$-$WL_n$ and placing a selected voltage on the appropriate bit access line $BL_0$-$BL_n$, thereby presenting the selected voltage to the corresponding storage element whose access transistor is turned on.

Memory circuit 300 includes a row selection means or row decoder 304 for selectively activating an individual word address line $WL_0$-$WL_n$, and the corresponding row of access transistors, during write and read cycles in response to coded row addresses. A sense amplifier and gating circuit 306 is connected to bit access lines $BL_0$-$BL_m$ for presenting a voltage to the selected storage cells during write cycles and for sensing storage element voltages during read cycles. Sense amplifier and gating circuit 306 also refreshes all memory cells in a selected row during both read and write cycles.

A read/write control logic and buffer circuit 310 is connected to a write data signal D and a write enable signal WE. Control circuit 310 is also connected to a column I/O line 308, which is in turn connected to sense amplifier and gating circuit 306. Control circuit 310 also receives and produces other control signals, not shown, which govern various timing and operational aspects of memory read and write cycles.

During a write cycle, external circuits produce write data signal D to present a selected logic voltage to memory circuit 300. Control circuit 310 places this logic voltage on I/O line 308 for writing to a memory cell within memory array 302. Sense amplifier and gating circuit 306 writes the logic voltage to memory cells in a selected row and selected columns of memory array 302.

Sense amplifier and gating circuit 306 receives a plurality of bit address lines $BA_0$-$BA_m$. Bit address lines $BA_0$ through $BA_m$ have addresses corresponding to column addresses, and therefore correspond to bit access lines $BL_0$-$BL_m$. During a write cycle, one or more of bit address lines $BA_0$-$BA_m$ are activated to address corresponding columns of memory cells within memory array 302 for writing. Sense amplifier and gating circuit 306 is responsive to bit address lines $BA_0$-$BA_m$ and I/O line 308 to place the selected logic voltage only on those bit access lines $BL_0$-$BL_m$ which correspond to the activated bit address lines $BA_0$-$BA_m$.

Memory circuit 300 includes a multiple address latching means 312 comprising a column address decoder 314 and a multiple line latch 316. Multiple address latching means 312 receives spaced coded column addresses or bit address line addresses and simultaneously permits writing to memory cells within columns of memory array 300 having column addresses between the spaced column addresses.

Column decoder 314 has a coded address bus input ADDIN to sequentially receive first and second coded column addresses. Column decoder 314 also has a plurality of decoded column address outputs $O_0^*$ through $O_m^*$, which are activated in response to receiving corresponding coded addresses at coded address bus input ADDIN. Each decoded output $O_0^*$-$O_m^*$ corresponds to a single coded column address within the sequence 0 through m and to the memory cell column having that address.

Multiple address latching means 312 also includes multiple line latch 316, which is identical in construction and operation to multiple line latch 112, shown in FIGS. 1 and 3. Accordingly, multiple line latch 316 has a plurality of address line inputs $AD_0^*$ through $AD_m^*$ for receiving decoded address signals, in this case column address signals, from column decoder 314. The number of address line inputs equals the number of columns of memory array 302 and may vary depending on the particular circuit.

Address line inputs $AD_0^*$-$AD_m^*$ are connected to corresponding decoded address outputs $O_0^*$-$O_m^*$ of column decoder 314 through a plurality of column address lines $CA_0^*$ through $CA_m^*$. Multiple line latch 316 also has a plurality of latched line outputs, $LO_0$ through $LO_m$, corresponding to address line inputs $AD_0^*$ through $AD_m^*$. Latched line outputs $LO_0$ through $LO_m$ are correspondingly connected to bit address lines $BA_0$-$BA_m$.

Multiple line latch 316 further includes a reset input $R_m$, which receives a column address strobe signal CAS*, and an enable input $E_m$, which receives a multicolumn enable signal MCE.

Memory circuit 300 receives a coded memory address signal ADDR from a multiplexed address bus 318. Address signal ADDR is time multiplexed-divided into a coded row address signal and a coded column address signal. The row and column address signals are thus received sequentially on multiplexed address bus 318. Memory circuit 300 has the further capability of sequentially receiving two spaced coded column addresses for specifying a range of columns which are to be simultaneously addressed for writing. Specifically, a first and a second column address are sequentially received to randomly specify a beginning and ending column address for writing.

Memory circuit 300 includes a row address latch 320 connected to multiplexed address bus 318. Row address latch 320 receives a row address select signal RAS* which indicates the presence of the coded row address signal on address bus 318. Row address latch 320 latches the coded row address from multiplexed address bus 318 when row address select signal RAS* goes low. The latched coded row address is presented to row decoder 304.

Memory circuit 300 also has an address comparator latch 322, which is identical in construction and operation to address comparator latch 202, shown in FIGS. 6 and 7. Address comparator latch 322 therefore has address inputs $A_0$-$A_k$ for receiving and latching coded column address signals from multiplexed address bus 318. Address comparator latch 322 has a latched address bus output ADDOUT and first and second strobe inputs $T_1$* and $T_2$. First strobe input $T_1$* receives column address strobe signal CAS*. Second strobe input $T_2$ receives a multi-column address strobe signal MCA. Latched address bus output ADDOUT is connected to coded address bus input ADDIN of column decoder 314 through a latched address bus 324.

In operation, address comparator latch 322 consecutively receives first and second coded column addresses from address bus 318. A beginning column address is defined as the lesser of the first and second column addresses, not necessarily corresponding to the first coded address. An ending column address is defined as the greater of the first and second column addresses, not necessarily corresponding to the second coded address. Address comparator latch 322 consecutively produces the first and second coded column addresses, as they are received and latched, at latched address bus output ADDOUT. After presenting the second coded column address, however, address comparator latch 322 determines which of the first and second coded column addresses is greater and then produces that address, i.e., the ending column address, at latched address output ADDOUT. This ensures correct operation of multiple line latch 316 when multi-column enable signal MCE is activated to address memory columns having addresses between the beginning and ending line addresses.

Figure 10:
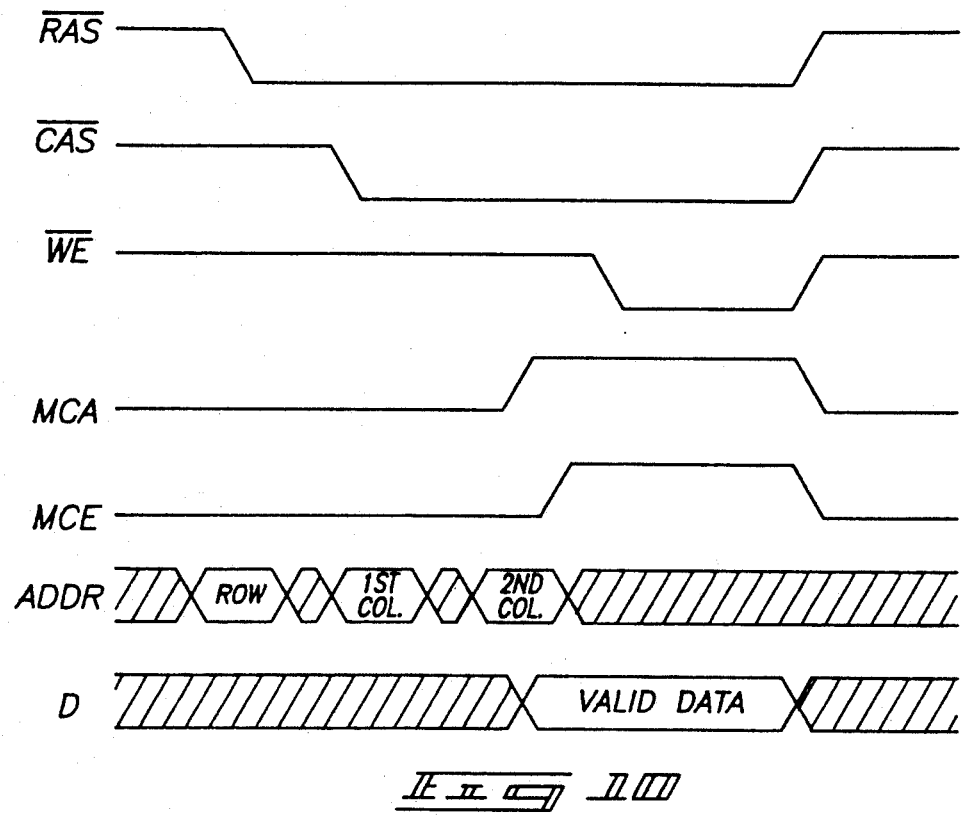
FIG. 10 is a timing diagram showing signals from the memory circuit of FIG. 9.
Figure 11:
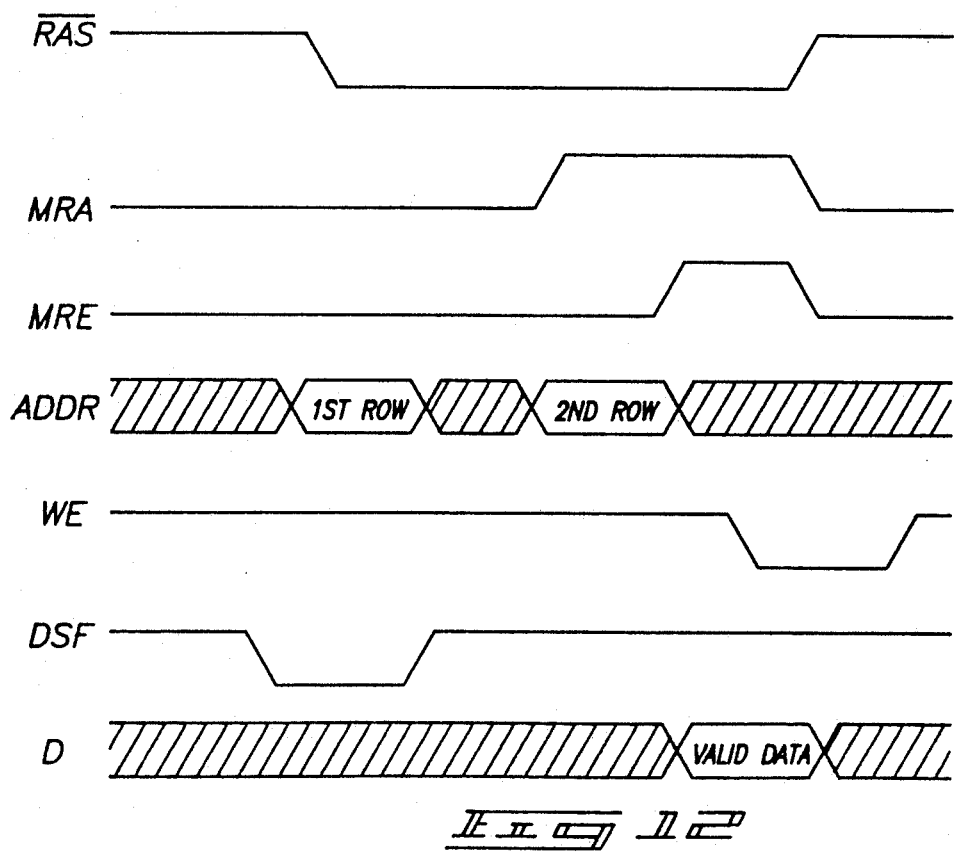
Figure 11:
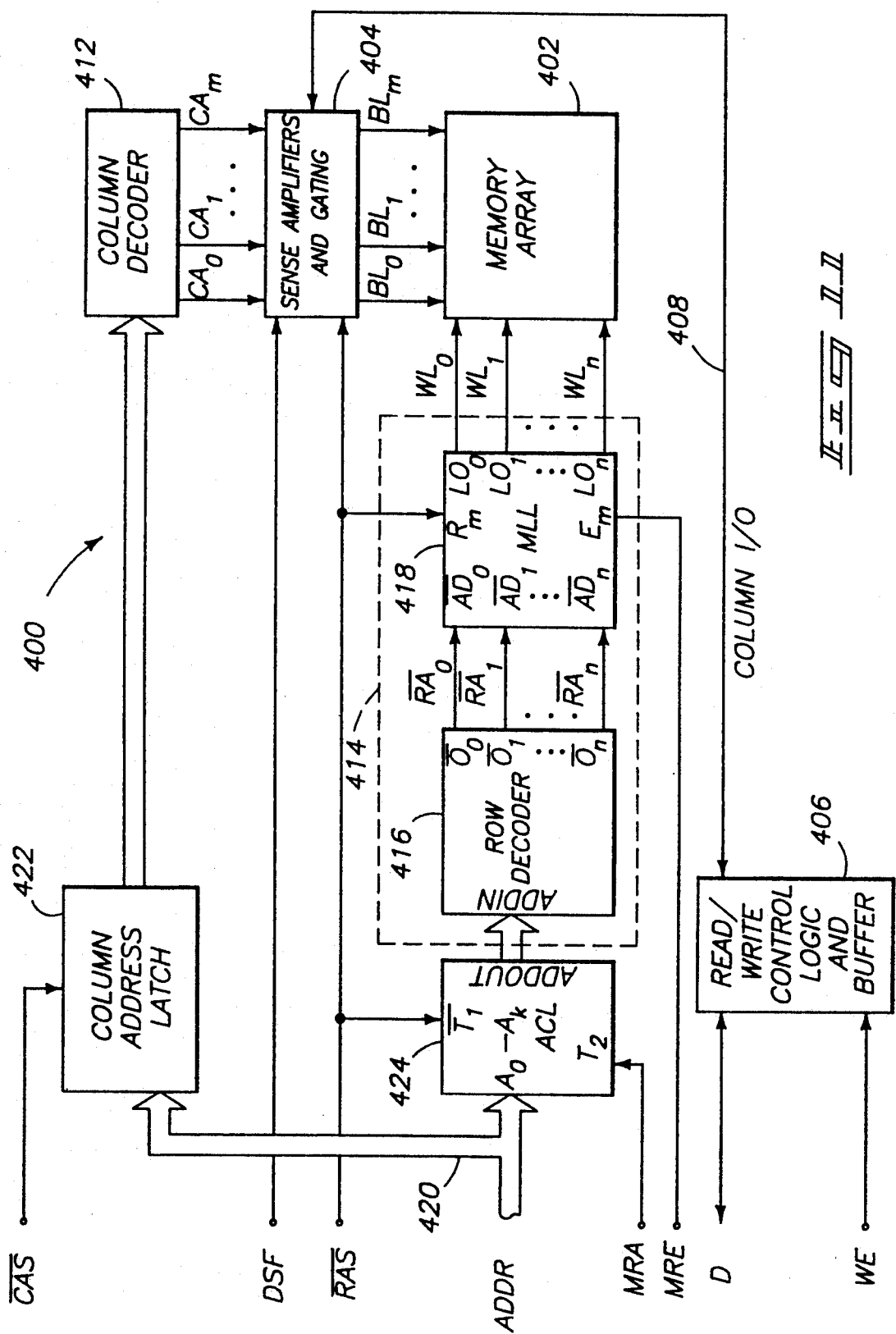

Referring now to FIG. 10, writing to memory cells within a range of memory columns is accomplished by first presenting a coded row address signal at address bus 318. Row address latch 320 is triggered by activating row address signal RAS* while the coded row address signal is thus presented. The latched coded row address signal is, as a result, presented to row decoder 304.

Subsequently, a first coded column address signal is presented at address bus 318. Address comparator latch 322 receives this address signal, latching it when CAS* is activated. Column decoder 314 receives the latched coded column first address signal at its ADDIN input and activates the corresponding decoded address output $O_0$*-$O_m$*. Multiple line latch 316, in response to the activated decoded address output, activates and latches its corresponding latched line output $LO_0$-$LO_m$.

Thereafter, a second coded column address signal is presented at address bus 318. Address comparator latch 322 receives this address signal, latching it when multi-column address strobe signal MCA is activated. Column decoder 314 receives the latched coded second column address signal at its ADDIN input and activates the corresponding decoded address output $O_0$*-$O_m$*. Multiple line latch 316, in response to the activated decoded address output, activates and latches its corresponding latched line output $LO_0$-$LO_m$.

Address comparator latch 322 then, after a momentary delay, presents the ending coded line address at its latched address bus output ADDOUT. Column decoder 314 activates the corresponding decoded address output $O_0$*-$O_m$*. Multi-column enable signal MCE is then activated, signaling multiple line latch 316 to activate all of its latched line outputs $LO_0$-$LO_m$ which have intermediate addresses between the first and second column addresses, inclusive. The series of memory cell columns having addresses corresponding to the activated latched line outputs are consequently addressed for writing.

Write enable signal WE is subsequently activated while a valid logic voltage is present at write data signal D. As a result, read/write control logic and buffer 310 initiates an actual write to the selected memory cells. The appropriate word address line $WL_0$-$WL_n$ is activated by row decoder 304 and the logic voltage is presented through the appropriate bit access lines $BA_0$-$BA_m$ to the addressed columns of memory cells within the selected row by sense amplifier and gating circuit 306.

Memory circuit 300 therefore has the capability of writing to a defined address contiguous series of memory cells within a single row. The series is defined by a beginning and ending column address, which may be supplied to memory circuit 300 in any order. A convention write to a single memory cell may also be performed in the usual manner, with multi-column address strobe MCA and multi-column enable signal MCE remaining low.

Figure 11:
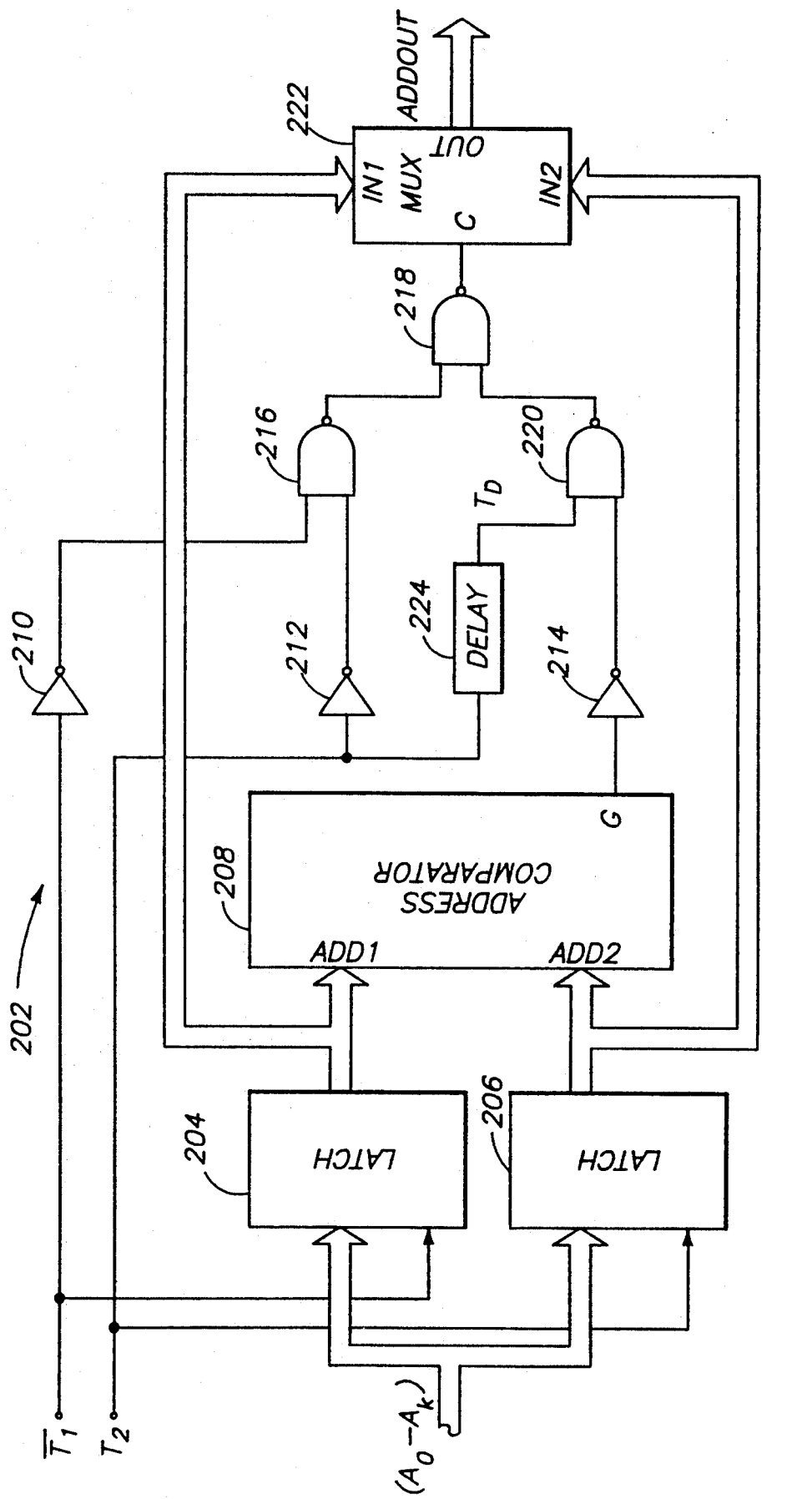
Fig. 11 is a schematic block diagram of a fourth preferred embodiment of a memory circuit according to this invention.

A fourth preferred embodiment of a semiconductor memory circuit of this invention is shown in FIG. 11. The memory circuit is generally designated by the numeral 400.

Memory circuit 400 includes a two-dimensional dynamic random access memory array 402 that is identical to memory array 302, shown in FIG. 9. Accordingly, memory array 402 has a plurality of memory cells arranged in rows and columns. Each row of memory cells has a row address in the sequence 0 through n and each column of memory cells has a column address in the sequence 0 through m. Memory cells are therefore uniquely identified in two-dimensional array 402 by a pair of matrix addresses: a row address and a column address.

Memory array 402 receives a plurality of word address lines $WL_0$ through $WL_n$ and a plurality of bit access lines $BL_0$ through $BL_m$. Word address lines $WL_0$-$WL_n$ have addresses corresponding to the sequence of row addresses and are connected to selectively address a row of memory cells for writing. Bit access lines $BL_0$-$BL_m$ have addresses corresponding to the sequence of column addresses and are connected to selectively permit writing to memory cells within a column.

Write cycles to memory cells are accomplished, as described above with reference to memory circuit 300 of FIG. 9, by activating appropriate word address lines $WL_0$-$WL_m$ and placing a logic voltage on a selected bit access line $BL_0$-$BL_m$.

A read/write control logic and buffer circuit 406 is also included, which is similar to read/write control logic and buffer 310 of FIG. 9. It is connected to receive a write data signal D and a write enable signal WE. Control circuit 406 is also connected to a column I/O line 408. Control circuit 406 receives and produces other control signals to govern various timing and operational aspects of memory read and write cycles.

Memory circuit 400 includes a column selection means or column decoder 412 which produces individual column address lines $CA_0$-$CA_m$. Column decoder 412 selectively activates column address lines $CA_0$-$CA_m$ in response to coded column addresses. Memory circuit 400 also has a sense amplifier and gating circuit 404 which is similar to sense amplifier and gating circuit 316 of FIG. 9. Sense amplifier and gating circuit 404 receives column address lines $CA_0$-$CA_m$ and is connected to bit access lines $BL_0$-$BL_m$ for presenting a voltage to the selected storage cells during write cycles and for sensing storage element voltages during read cycles. It is also connected to column I/O line 408.

Sense amplifier and gating circuit 404 is somewhat different than the corresponding circuit shown in FIG. 9 in that it receives a special function signal DSF. Special function signal DSF and a row address strobe signal RAS* are activated when it is desired to simultaneously write a single logic voltage to memory cells in all columns of memory array 402 during a single write cycle. Sense amplifier and gating circuits utilizing this feature are known in the art, where such a write cycle is commonly referred to as a "flash write cycle."

In conventional circuits employing flash write cycles, a single row address is specified, and, if special function signal DSF is active when RAS* goes low, a single logic voltage is written to each memory cell in that row. Memory circuit 400 adds the further ability to specify multiple rows, with a logic voltage being simultaneously written to every cell within each specified memory row.

Memory circuit 400 includes a multiple address latching means 414 comprising a row address decoder 416 and a multiple line latch 418. Multiple address latching means 414 receives coded beginning and ending row addresses or word address line addresses. It simultaneously addresses rows of memory cells having row addresses between the beginning and ending row addresses, inclusive.

Row decoder 416 has a coded address bus input ADDIN to sequentially receive first and second coded row addresses. Row decoder 416 also has a plurality of decoded row address outputs $O_0^*$ through $O_n^*$ which are activated in response to receiving corresponding coded addresses at coded address bus input ADDIN. Each decoded output $O_0^*$-$O_n^*$ corresponds to a single coded row address within the sequence 0 through n, and to the memory cell row having that address.

Multiple address latching means 414 also includes multiple line latch 418, which is identical in construction and operation to multiple line latch 112, shown in FIGS. 1 and 3. Accordingly, multiple address latching means 418 has a plurality of address line inputs $AD_0^*$ through $AD_n^*$ for receiving decoded address signals, in this case row address signals, from row decoder 416.

The number of address line inputs corresponds to the number of rows within memory array 402. Address line inputs $AD_0^*$-$AD_n^*$ are connected to corresponding decoded address outputs $O_0^*$-$O_n^*$ of address decoder 416 through a plurality of row address lines $RA_0^*$ through $RA_n^*$. Multiple line latch 418 also has a plurality of latched line outputs $LO_0$ through $LO_n$, corresponding to address line inputs $AD_0^*$ through $AD_n^*$, which are correspondingly connected to word address lines $WL_0$-$WL_m$.

Multiple line latch 418 further includes a reset input $R_m$, which receives row address strobe signal RAS*, and an enable input $E_m$, which receives a multi-row enable signal MRE.

Memory circuit 400 receives a coded memory address signal ADDR from a multiplexed address bus 420. Address signal ADDR is time multiplexed, i.e., divided into a coded row address signal and a coded column address signal. The row and column address signals are received sequentially by multiplexed address bus 420. Memory circuit 400 has the further capability of sequentially receiving two spaced coded row addresses for specifying a range of rows which are to be addressed for writing. Thus, a first and a second row address are received which specify a beginning and ending row address for writing.

Memory circuit 400 includes a column address latch 422 connected to multiplexed address bus 420. Column address latch 422 receives a column address select signal CAS* which indicates the presence of the coded column address signal on address bus 420. Column address latch 422 latches the coded column address from multiplexed address bus 420 when column address select signal CAS* goes low. The latched coded column address is presented to column decoder 412.

Memory circuit 400 also has an address comparator latch 424, which is identical in construction and operation to address comparator latch 202, shown in FIGS. 6 and 7. Address comparator latch 424 thus has address inputs $A_0$-$A_k$ for receiving and latching coded row address signals from multiplexed address bus 420. Address comparator latch 424 has a latched address bus output ADDOUT and first and second strobe inputs $T_1^*$ and $T_2$. First strobe input $T_1^*$ receives row address strobe signal RAS*. Second strobe input $T_2$ receives a multi-row address strobe signal MRA. Latched address bus output ADDOUT is connected to coded address bus input ADDIN of row decoder 416.

In operation, address comparator latch 424 consecutively receives first and second coded row addresses from address bus 420. The beginning row address is defined as the lesser of the first and second row addresses, not necessarily corresponding to the first coded row address. The ending row address is defined as the greater of the first and second row addresses, not necessarily corresponding to the second coded row address. Address comparator latch 424 consecutively produces the first and second coded row addresses, as they are received and latched, at latched address bus output ADDOUT. After presenting the second coded row address, however, address comparator latch 424 determines which of the first and second coded row addresses is greater and then produces that address, the ending row address, at latched address output ADDOUT. This is necessary to ensure correct operation of multiple line latch 418 when multi-row enable signal MRE is activated to address the memory rows having addresses between the beginning and ending line addresses.

Referring now to FIG. 12, a flash write to memory cells within a range of memory rows is accomplished by first presenting a coded first row address signal at address bus 420. Address comparator latch 424 receives this address signal, latching it when RAS* is activated. In addition, special function signal DSF is active as RAS* is activated to initiate flash mode. Row decoder 416 receives the latched coded first address signal at its ADDIN input and activates the corresponding decoded address output $O_0^*$-$O_n^*$. Multiple line latch 418, in response to the activated decoded address output, activates and latches its corresponding latched line output $LO_0$-$LO_n$.

Thereafter, a second coded row address signal is presented at address bus 420. Address comparator latch 424 receives this address signal, latching it when multi-row address strobe signal MRA is activated. Row decoder 416 receives the latched coded second row address signal at its ADDIN input and activates the corresponding decoded address output $O_0^*$-$O_n^*$. Multiple line latch 418, in response, activates and latches its corresponding latched line output $LO_0$-$LO_n$.

Address comparator latch 424 then, after a momentary delay, presents the ending coded row address at its latched address bus output ADDOUT. Row decoder 416 activates the corresponding decoded address output $O_0^*$-$O_m^*$. Multi-row enable signal MRE is then activated, signaling multiple line latch 418 to activate all of its latched line outputs which have addresses between the first and second row addresses, inclusive.

Write enable signal WE is subsequently activated while a valid logic voltage is present at write data signal D. As a result, read/write control logic and buffer 406 initiates an actual write to the addressed rows of memory cells. As long as DSF becomes active before RAS*, sense amplifier and gating circuit 404 will present the logic voltage to every column of memory cells. The selected word address lines $WL_0$-$WL_n$ are activated by multiple line latch 418 to address only the selected rows for writing.

Memory circuit 400 therefore has the capability of writing to all memory cells within defined contiguous series of memory cell rows. The series is defined by a beginning and ending row address, which may be supplied to memory circuit 400 in any order. A conventional write to a single memory cell or a conventional flash write to a single row of memory cells may also be performed, with multi-row address strobe MRA and multi-row enable signal MRE remaining low.

In addition to its use in the embodiments described above, the invention is useful in multi-port memories. FIG. 13 shows a multi-port memory which utilizes a serial access memory (SAM) in conjunction with a dynamic random access memory array. The multi-port memory circuit is generally designated with the numeral 500. Multi-port memory circuit 500 is, for the most part, identical to memory circuit 400 of FIG. 11. Accordingly, circuit 500 comprises a two-dimensional memory array 502; a sense amplifier and gating circuit 504; a read/write control logic and buffer circuit 506; a column I/O line 508; a column decoder 512; a multiple address latching means 514; a row address decoder 516; a multiple line latch 518; a multiplexed address bus 520; a column address latch 522; and an address comparator latch 524. These elements are identical to the following elements of memory circuit 400, respectively: two-dimensional memory array 402; sense amplifier and gating circuit 404; read/write control logic and buffer circuit 406; column I/O line 408; column decoder 412; multiple address latching means 414; row address decoder 416; multiple line latch 418; multiplexed address bus 420; column address latch 422; and address comparator latch 424. The elements are connected as already described with reference to FIG. 11.

Multi-port memory circuit 500 also includes a serial access memory (SAM) 530. Serial access memory 530 is a linear array of m+1 memory cells. Each cell corresponds to a single column of random access memory array 502. A data bit can be written to either random access memory 502 or to serial access memory 530. Data bits can also be transferred in parallel directly from serial access memory 530 to selected rows of random access memory 502.

Serial access memory 530 has a plurality of bit transfer lines $TL_0$-$TL_m$ connected to corresponding columns of random access memory array 502. A plurality of SAM address lines $SA_0$-$SA_m$ are connected to selectively address corresponding individual memory cells within serial access memory 530. A bit I/O line 534 is connected to serial access memory 530 for writing to addressed memory cells within serial access memory 530.

A SAM address latch and counter 532 receives a coded SAM address from multiplexed address bus 520, and provides a latched and successively incremented coded SAM address to a SAM address decoder 536.

Read/write control logic and buffer circuit 506 is shown connected to serial access memory 530, SAM address latch and counter 532, and SAM decoder 536. Other connections, from control circuit 506 to various elements of multi-port memory circuit 500, not shown, provide detailed control of read, write, and transfer operations. Control circuit 506 receives a serial enable input signal SE* and a transfer enable signal TR* which are used to direct read and write cycles involving serial access memory 530.

With serial enable input signal SE and transfer enable signal TR* low, multi-port memory circuit 500 functions in the same way as memory circuit 400 of FIG. 11. Conventional read and write cycles can be performed, including flash write cycles to entire rows of memory cells within random access memory array 502. Multiple address latching means 514 can also be utilized to write a single bit to multiple entire rows, as previously described.

In addition, read and write cycles can be performed on serial access memory 530. Methods of performing such read and write cycles in a multi-port DRAM are described in published Micron Technology Corporation's book entitled "MOS Data Book (1990/A)", section 3, the disclosure of which is incorporated by reference.

Bidirectional transfers can also be performed between serial access memory 530 and random access memory 502. A transfer operation is initiated by lowering transfer enable signal TR* before activating RAS*. Write enable signal WE indicates the direction of the transfer, and must be low as RAS* initially goes low for a SAM to DRAM transfer. In this case, the coded row address or row addresses received at multiplexed address bus 520 indicate the row or rows of random access memory 502 that are to be written to from serial access memory 530. First and second row addresses are latched from address bus 520 by address comparator latch 524 as RAS* and MRA are activated, respectively. Multiple line latch 518 responds by addressing the specified series of memory cell rows. To complete the transfer, transfer enable TR* is taken high while RAS* and CAS* are still low. The data bits from serial access memory 530 are then written in parallel to the corresponding locations in the addressed rows of random access memory 502.

Multiple address latching means 514 thus allows data from serial access memory 530 to be transferred to multiple rows of random access memory 502 in a single transfer cycle.

The invention can also be implemented in a multiport memory circuit to allow simultaneous writing to multiple memory cells within the linear serial access array of a multi-port memory. Implementing such a circuit merely requires integration of the circuits shown in FIG. 1 with the linear array of a multi-port memory.

As shown above, the invention is useful in a variety of implementations where it is needed to write to a defined series of memory cells or to address a defined series of address contiguous memory cell groups. The invention is particularly appropriate for DRAM circuits, which already utilize multiplexed address buses. Writing efficiency is improved by the ability to simultaneously write to selected groups of memory cells within a single write cycle, and the groups are not necessarily limited to being a single entire row or column of memory cells. Improved writing efficiency is attained without requiring improved access times to individual memory cells themselves.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

I claim:

1. In a semiconductor memory circuit having a plurality of addressable memory cells with each memory cell being identified by an individual address within a series of address contiguous addresses; a multiple cell addressing circuit, comprising:
    an address bus for receiving at least two spaced individual addresses within the series of contiguous addresses, one of said individual addresses defining a beginning address and the other individual address defining an ending address; and
    a multiple address latching means responsive to the beginning and ending addresses for simultaneously addressing a group of contiguously addressed memory cells within the series between the beginning and ending addresses;
    wherein the spaced individual addresses are coded and the multiple address latching means comprises:
        an address decoder responsive to the spaced coded individual addresses and having a plurality of decoded address outputs; and
        a multiple line means responsive to the decoded address outputs for simultaneously addressing the group of contiguously addressed memory cells.

2. In a semiconductor memory circuit as recited in claim 1, further comprising means for simultaneously writing to the group of addressed memory cells.

3. In a semiconductor memory circuit as recited in claim 1, wherein the address bus is multiplexed for sequentially receiving the spaced individual addresses.

4. In a semiconductor memory circuit as recited in claim 1, wherein the memory cell array has a plurality of rows and columns of memory cells, the multiple address latching means being connected to address a series of memory cell rows.

5. In a semiconductor memory circuit as recited in claim 1, wherein the memory cell array has a plurality of rows and columns of memory cells, the multiple address latching means being connected to address a series of memory cell columns.

6. In a semiconductor memory circuit having a plurality of addressable memory cells with each memory cell being identified by an individual address within a series of address contiguous addresses; a multiple cell addressing circuit, comprising:
    an address bus for receiving at least two spaced individual addresses within the series of contiguous addresses, one of said individual addresses defining a beginning address and the other individual address defining an ending address;
    a multiple address latching means responsive to the beginning and ending addresses for simultaneously addressing a group of contiguously addressed memory cells within the series between the beginning and ending addresses; and
    address comparator means for receiving and comparing the spaced individual addresses to determine the ending address.

7. In a semiconductor memory circuit having a plurality of addressable memory cells with each memory cell being identified by an individual address within a series of address contiguous addresses; a multiple cell addressing circuit, comprising:
    an address bus for receiving at least two spaced individual addresses within the series of contiguous addresses, one of said individual addresses defining a beginning address and the other individual address defining an ending address;
    a multiple address latching means responsive to the beginning and ending addresses for simultaneously addressing a group of contiguously addressed memory cells within the series between the beginning and ending addresses; and
    a comparator means for (a) receiving the spaced individual addresses in random order, (b) consecutively producing the spaced individual addresses in the order received, and (c) subsequently determining and producing the ending individual address, wherein the multiple address latching means receives the spaced individual addresses and the ending individual address from the comparator means.

8. In a semiconductor memory circuit as recited in claim 7, the multiple address latching means further comprising a multiple line latch means for selectively addressing memory cells, the multiple line latch means being operatively connected to receive the individual addresses from the comparator means and being for:
    (a) addressing memory cells that are identified by the spaced individual addresses; and
    (b) addressing further memory cells that are identified by individual addresses between the spaced individual addresses.

9. In a semiconductor memory circuit as recited in claim 8, wherein the spaced individual addresses are coded and the multiple address latching means further comprises an address decoder connected to receive the spaced coded individual addresses and having a plurality of decoded address outputs which are received by the multiple line latch means.

10. A semiconductor memory circuit, comprising:
a plurality of memory cells;
a plurality of address lines, each address line being connected to selectively address at least one corresponding memory cell for writing;
a multiple address latching means for sequentially receiving at least two spaced line addresses and being operatively connected to the address lines for simultaneously addressing memory cells corresponding to intermediate address lines having line addresses between the spaced line addresses; and
an address comparator means for receiving and comparing the spaced line addresses to determine an ending line address.

11. A semiconductor memory circuit as recited in claim 10, further comprising means for writing to the addresses memory cells.

12. A semiconductor memory circuit as recited in claim 10, further comprising a multiplexed address bus for sequentially receiving the spaced line addresses.

13. A semiconductor memory circuit, comprising:
plurality of memory cells;
a plurality of address lines, each address line being connected to selectively address at least one corresponding memory cell for writing;
a multiple address latching means for sequentially receiving a least two spaced line addresses and being operatively connected to the address lines for simultaneously addressing memory cells corresponding to intermediate address lines having line addresses between the spaced line addresses; and
a comparator means for (a) receiving the spaced line addresses in random order, (b) producing the spaced line addresses in the order received, and (c) subsequently determining and producing an ending line address, wherein the multiple address latching means receives the line addresses from the comparator means for addressing the memory cells.

14. A semiconductor memory circuit as recited in claim 13, the multiple address latching means further comprising a multiple line latch means connected to the address lines, operatively connected to receive the line addresses from the comparator means and being for:
(a) addressing memory cells corresponding to address lines having the spaced line addresses; and
(c) addressing memory cells corresponding to address lines having addresses between the spaced line addresses.

15. In a semiconductor memory circuit as recited in claim 14, wherein the spaced line addresses are coded and the multiple address latching means further comprises an address decoder connected to receive the coded line addresses from the comparator means and having a plurality of decoded address output which are received by the multiple line latch means.

16. A semiconductor memory circuit, comprising:
plurality of memory cells;
a plurality of address lines, each address line being connected to selectively address at least one corresponding memory cell for writing;
a multiple address latching means for sequentially receiving at least two spaced line addresses and being operatively connected to the address lines for simultaneously addressing memory cells corresponding to intermediate address lines having line addresses between the spaced line addresses;
wherein the spaced line addresses are coded and the multiple address latching means comprises:
an address decoder responsive to the spaced coded line addresses and having a plurality of decoded address outputs; and
a multiple line latch means responsive to the decoded address outputs and operatively connected to the address lines for simultaneously addressing memory cells corresponding to the intermediate address lines for writing.

17. A random access memory integrated circuit, comprising:
an array of memory cells arranged in rows and columns, wherein each row of memory cells has a row address and each column of memory cells has a column address;
a plurality of word address lines, each word address line being connected to selectively address a row of memory cells for writing; and
a multiple address latching means for receiving at least two spaced row addresses and being connected to the word address lines for simultaneously addressing intermediate rows of memory cells having row addresses between the spaced row addresses; and
an address comparator means for receiving and comparing the spaced row addresses to determine an ending row address.

18. A random access memory integrated circuit as recited in claim 17, further comprising a multiplexed address bus for sequentially receiving the spaced row addresses.

19. A random access memory integrated circuit as recited in claim 17, further comprising means for simultaneously writing to addressed rows of memory cells.

20. A random access memory integrated circuit, comprising:
an array of memory cells arranged in rows and columns, wherein each row of memory cells has a row address and each column of memory cells has a column address;
a plurality of word address lines, each word address line being connected to selectively address a row of memory cells for writing;
a multiple address latching means for receiving at least two spaced row addresses and being connected to the word address lines for simultaneously addressing intermediate rows of memory cells having row addresses between the spaced row addresses; and
a comparator means for (a) receiving the spaced individual addresses in random order, (b) producing the spaced row addresses in the order received, and (c) subsequently determining and producing an ending row address, wherein the multiple address latching means receives the row addresses from the comparator means for addressing the intermediate rows of memory cells for writing.

21. A random access memory integrated circuit as recited in claim 20, the multiple address latching means further comprising a multiple line latch means connected to the word address lines and operatively connected to receive the row addresses from the compatator means and being for:

(a) latching word address lines to address the rows of memory cells having the spaced row addresses; and (b) latching word address lines to address rows of memory cells having addresses between the spaced row addresses.

22. In a random access memory integrated circuit as recited in claim 21, wherein the spaced row addresses are coded and the multiple address latching means further comprises an address decoder connected to receive the coded row addresses and having a plurality of decoded address output which are received by the multiple line latch means.

23. A random access memory integrated circuit, comprising:

an array of memory cells arranged in rows and columns, wherein each row of memory cells has a row address and each column of memory cells has a column address;

a plurality of word address lines, each word address line being connected to selectively address a row of memory cells for writing;

a multiple address latching means for receiving at least two spaced row addresses and being connected to the word address lines for simultaneously addressing intermediate rows of memory cells having row addresses between the spaced row addresses;

a plurality of bit address lines, each bit address line being connected to selectively permit writing to addressed memory cells within a column of memory cells; and a flash writing means connected to the bit address lines for simultaneously permitting writing to all columns of memory cells in the addressed rows of the memory cell array.

24. A random access memory integrated circuit, comprising:

an array of memory cells arranged in rows and columns, wherein each row of memory cells has a row address and each column of memory cells has a column address;

a plurality of word address lines, each word address line being connected to selectively address a row of memory cells for writing;

a multiple address latching means for receiving at least two spaced row addresses and being connected to the word address lines for simultaneously addressing intermediate rows of memory cells having row addresses between the spaced row addresses;

wherein the spaced row addresses are coded and the multiple address latching means comprises:

an address decoder to receive row addresses and to produce a plurality of decoded address outputs; and a multiple line latch means responsive to the decoded address outputs and being connected to the word address lines for simultaneously addressing memory cells in rows having row addresses between the spaced row addresses.

25. A random access memory integrated circuit, comprising:

an array of memory cells arranged in rows and columns, wherein each row of memory cells has a row address and each column of memory cells has a column address;

a plurality of bit address lines, each bit address line being connected to selectively permit writing to memory cells within a column of memory cells;

a multiple address latching means for receiving at least two spaced column addresses and being connected to the bit address lines for simultaneously permitting writing to memory cells in intermediate columns having column addresses between the spaced column addresses; and an address comparator means for receiving and comparing the spaced column addresses to determine an ending column address.

26. A random access memory integrated circuit as recited in claim 25, further comprising a row selection means for addressing rows of memory cells for writing.

27. A random access memory integrated circuit as recited in claim 26, further comprising means for writing to memory cells that are in addressed rows and selected columns of memory cells.

28. A random access memory integrated circuit as recited in claim 25, further comprising a multiplexed address bus for sequentially receiving the spaced column addresses.

29. A random access memory integrated circuit as recited in claim 25, further comprising a means for writing to at least one memory cell in each selected column.

30. A random access memory integrated circuit, comprising:

an array of memory cells arranged in rows and columns, wherein each row of memory cells has a row address and each column of memory cells has a column address;

a plurality of bit address lines, each bit address line being connected to selectively permit writing to memory cells within a column of memory cells;

a multiple address latching means for receiving at least two spaced column addresses and being connected to the bit address lines for simultaneously permitting writing to memory cells in intermediate columns having column addresses between the spaced column addresses; and a comparator means for (a) receiving the spaced column addresses in random order, (b) producing the spaced column addresses in the order received, and (c) subsequently determining and producing an ending column address, wherein the multiple address latching means receives the column addresses from the comparator means for permitting writing to the intermediate columns of memory cells.

31. A random access memory integrated circuit as recited in claim 30, the multiple address latching means further comprising a multiple line latch means connected to the bit address lines and operatively connected to receive the column addresses from the comparator means and being for:

(a) latching bit address lines to permit writing to the columns of memory cells having the spaced column addresses; and (b) latching a plurality of bit address lines to permit writing to columns of memory cells having addresses between the spaced column addresses.

32. In a random access memory integrated circuit as recited in claim 31, wherein the spaced column addresses are coded and the multiple address latching means further comprises an address decoder connected to receive the coded column addresses and having a plurality of decoded address outputs which are received by the multiple line latch means.

33. A random access memory integrated circuit, comprising:

an array of memory cells arranged in rows and columns, wherein each row of memory cells has a row address and each column of memory cells has a column address;

a plurality of bit address lines, each bit address line being connected to selectively permit writing to memory cells within a column of memory cells;

a multiple address latching means for receiving at least two spaced column addresses and being connected to the bit address lines for simultaneously permitting writing to memory cells in intermediate columns having column addresses between the spaced column addresses;

wherein the spaced column addresses are coded and the multiple address latching means comprises:

an address decoder to receive coded column addresses and to produce a plurality of decoded address outputs; and a multiple line latch means responsive to the decoded address outputs and being connected to the bit address lines for simultaneously permitting writing to memory cells in columns having column addresses between the spaced column addresses.

34. A semiconductor memory circuit, comprising:

a two-dimensional array of randomly accessible memory cells arranged in rows and columns;

a linear array of memory cells having a memory cell corresponding to each column of the two-dimensional array, wherein each memory cell of the linear array has a memory cell address within a sequence; and a multiple address latching means for receiving at least two spaced memory cell addresses and for simultaneously addressing intermediate memory cells within the linear array having addresses between the spaced memory cell addresses for writing.

35. A semiconductor memory circuit as recited in claim 34, further comprising means for simultaneously writing to the addressed memory cells of the linear memory array.

36. A semiconductor memory circuit as recited in claim 34, further comprising a multiplexed address bus for sequentially receiving the spaced memory cell addresses.

37. A semiconductor memory circuit as recited in claim 34, wherein the multiple address latching means comprises:

an address decoder responsive to the spaced coded memory cell addresses and having a plurality of decoded address outputs; and a multiple line latch means responsive to the decoded address outputs for simultaneously addressing the memory cells within the linear array having addresses between the spaced memory cell addresses.

38. A semiconductor memory circuit as recited in claim 34, further comprising an address comparator means for receiving and comparing the spaced memory cell addresses to determine an ending memory cell address.

39. A semiconductor memory circuit as recited in claim 34, further comprising a comparator means for (a) receiving the spaced memory cell addresses in random order, (b) producing the spaced memory cell addresses in the order received, and (c) subsequently determining and producing an ending memory cell address, wherein the multiple address latching means receives the memory cell addresses from the comparator means for addressing the intermediate memory cells.

40. In a semiconductor memory circuit as recited in claim 39, the multiple address latching means further comprising a multiple line latch means for selectively addressing memory cells within the linear array, operatively connected to receive the memory cell addresses from the comparator means and being for:

(a) addressing the memory cells having the spaced memory cell addresses; and (b) addressing memory cells having addresses between the spaced memory cell addresses.

41. In a semiconductor memory circuit as recited in claim 40, wherein the spaced memory cell addresses are coded and the multiple address latching means further comprises an address decoder connected to receive the coded memory cell addresses and having a plurality of decoded address outputs which are received by the multiple line latch means.

42. A semiconductor memory circuit, comprising:

a two-dimensional array of memory cells arranged in rows and columns, wherein each row of memory cells has a row address and each column of memory cells has a column address;

a linear array of memory cells having a memory cell corresponding to each column of the two-dimensional memory cell array; and a multiple address latching means for receiving at least two spaced row addresses and for simultaneously addressing intermediate rows of memory cells within the two-dimensional array having row addresses between the spaced row addresses for writing.

43. A semiconductor memory circuit as recited in claim 42, further comprising a write circuit for simultaneously writing from each cell of the linear memory array to the memory cells of the two-dimensional array that are both (a) in the corresponding column and (b) within the one of the simultaneously addressed rows of memory cells.

44. A semiconductor memory circuit as recited in claim 42, further comprising a multiplexed address bus for sequentially receiving the spaced row addresses.

45. A semiconductor memory circuit as recited in claim 42, wherein the spaced row addresses are coded and the multiple address latching means comprises:

an address decoder responsive to the spaced coded row addresses and having a plurality of decoded address outputs; and a multiple line latch means responsive to the decoded address outputs for simultaneously addressing the intermediate rows of memory cells within the two-dimensional array having row addresses between the spaced row addresses.

46. A semiconductor memory circuit as recited in claim 42, further comprising address comparator means for receiving and comparing the spaced row addresses to determine an ending row address.

47. A semiconductor memory circuit as recited in claim 42, further comprising a comparator means for (a) receiving the spaced row addresses in random order, (b) producing the spaced row addresses in the order received, and (c) subsequently determining and producing an ending row address, wherein the multiple address latching means receives the row addresses from the comparator means for addressing the intermediate rows of memory cells.

48. In a semiconductor memory circuit as recited in claim 47, the multiple address latching means further comprising a multiple line latch means for selectively addressing individual rows of memory cells, operatively connected to receive the row addresses from the comparator means and being for:

(a) addressing rows of memory cells having the spaced row addresses; and
(c) addressing rows of memory cells having row addresses between the spaced row addresses.

49. In a semiconductor memory circuit as recited in claim 48, wherein the spaced row addresses are coded and the multiple address latching means further comprises an address decoder connected to receive the coded row addresses and having a plurality of decoded address outputs which are received by the multiple line latch means.

* * * * *